(12) United States Patent
Mazaki et al.

(10) Patent No.: US 11,926,227 B2
(45) Date of Patent: Mar. 12, 2024

(54) MOVING-OBJECT POWER SUPPLY SYSTEM

(71) Applicant: DENSO CORPORATION, Kariya (JP)

(72) Inventors: Kouji Mazaki, Kariya (JP); Nobuhisa Yamaguchi, Kariya (JP); Eisuke Takahashi, Kariya (JP); Mitsuru Shibanuma, Kariya (JP); Shinpei Takita, Kariya (JP); Masaya Takahashi, Kariya (JP); Hayato Sumiya, Kariya (JP); Masaki Kanesaki, Kariya (JP); Takuya Kiguchi, Kariya (JP); Kazuhiro Uda, Kariya (JP); Yuusei Nakayashiki, Kariya (JP)

(73) Assignee: DENSO CORPORATION, Kariya (JP)

( * ) Notice: Subject to any disclaimer, the term of this patent is extended or adjusted under 35 U.S.C. 154(b) by 129 days.

(21) Appl. No.: 17/528,718

(22) Filed: Nov. 17, 2021

(65) Prior Publication Data
US 2022/0072965 A1    Mar. 10, 2022

Related U.S. Application Data

(63) Continuation of application No. PCT/JP2020/016317, filed on Apr. 13, 2020.

(30) Foreign Application Priority Data

May 17, 2019    (JP) .................................. 2019-093555

(51) Int. Cl.
*B60L 53/12*    (2019.01)
*B60L 53/60*    (2019.01)
(Continued)

(52) U.S. Cl.
CPC ................ *B60L 53/12* (2019.02); *B60L 53/60* (2019.02); *G01R 31/52* (2020.01); *H02J 50/12* (2016.02); *H02J 50/40* (2016.02); *H02J 50/90* (2016.02)

(58) Field of Classification Search
CPC .. B60L 53/12; B60L 53/60; B60L 3/00; B60L 53/39; B60L 53/122; G01R 31/52;
(Continued)

(56) References Cited

U.S. PATENT DOCUMENTS 4,449,115 A * 5/1984 Koerner ................. G01V 3/101
340/941
6,087,964 A * 7/2000 Allen ..................... G08G 1/042
340/941
(Continued)

FOREIGN PATENT DOCUMENTS

JP    2017-070181 A    4/2017

*Primary Examiner* — Daniel Kessie
*Assistant Examiner* — Brian K Baxter
(74) *Attorney, Agent, or Firm* — Oliff PLC

(57) ABSTRACT

In a moving-object power supply system, a control unit selects, as a power transmission segment, one of segments included in at least one power transmission section. The control unit supplies, through a power supply circuit, power to the power transmission segment to thereby generate a magnetic field through a power transmission coil of the power transmission segment. The control unit determines, based on an ascertained first electrical characteristic of the power transmission segment and an ascertained second electrical characteristic of at least one power non-transmission segment, whether there is a malfunction in each of the power transmission segment and the at least one power non-transmission segment.

8 Claims, 19 Drawing Sheets

(51) Int. Cl.
   *G01R 31/52* (2020.01)
   *H02J 50/12* (2016.01)
   *H02J 50/40* (2016.01)
   *H02J 50/90* (2016.01)

(58) Field of Classification Search
   CPC . H02J 50/12; H02J 50/40; H02J 50/90; H01F 38/14; Y02T 10/7072; B60M 7/00
   See application file for complete search history.

(56) References Cited

U.S. PATENT DOCUMENTS

| | | | | |
|---|---|---|---|---|
| 11,376,966 B2* | 7/2022 | Covic | ............ | B60M 7/00 |
| 2007/0247005 A1* | 10/2007 | Tetlow | ............ | H05B 45/37 |
| | | | | 307/104 |
| 2013/0154553 A1* | 6/2013 | Steele | ............ | B60M 7/003 |
| | | | | 320/108 |
| 2013/0214591 A1* | 8/2013 | Miller | ............ | B60L 53/126 |
| | | | | 307/104 |
| 2014/0125286 A1* | 5/2014 | Cho | ............ | B60L 50/51 |
| | | | | 320/128 |
| 2014/0320079 A1* | 10/2014 | Kondo | ............ | H04B 5/0037 |
| | | | | 320/108 |
| 2015/0246614 A1* | 9/2015 | Dames | ............ | B60L 5/005 |
| | | | | 191/10 |
| 2017/0098959 A1 | 4/2017 | Kikuchi et al. | | |
| 2017/0182903 A1* | 6/2017 | Kwasnick | ............ | B60L 53/122 |
| 2017/0356950 A1* | 12/2017 | Chae | ............ | B60L 53/12 |
| 2017/0361725 A1* | 12/2017 | Seong | ............ | G01D 5/2073 |
| 2018/0026482 A1* | 1/2018 | Asano | ............ | H02J 50/12 |
| | | | | 307/104 |
| 2018/0178666 A1* | 6/2018 | Javaid | ............ | H02J 50/90 |
| 2019/0267841 A1* | 8/2019 | Richter | ............ | H02J 7/0029 |
| 2020/0076242 A1* | 3/2020 | Narayana Bhat | ............ | H02J 50/90 |
| 2021/0237602 A1* | 8/2021 | Wang | ............ | B60L 53/12 |

* cited by examiner

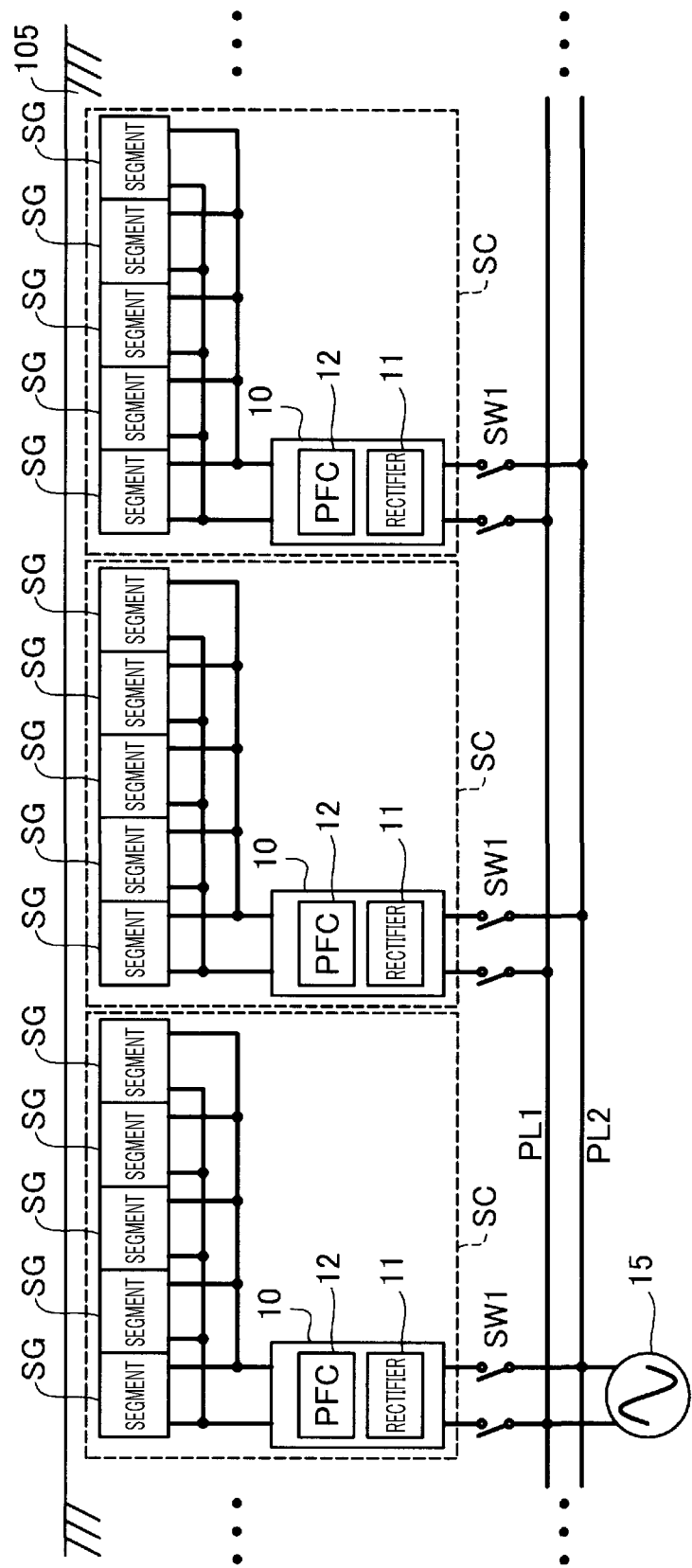

GROUND FAULT (SHORT-CIRCUIT FAULT OR OPEN FAULT) FOR
POWER TRANSMISSION COIL OF POWER NON-TRANSMISSION SEGMENT

SHORT-CIRCUIT FAULT FOR SWITCHING TRANSISTOR OF INVERTER

MOVING-OBJECT POWER SUPPLY SYSTEM

CROSS-REFERENCE TO RELATED APPLICATION

The present application is a bypass continuation application of currently pending international application No. PCT/JP2020/16317 filed on Apr. 13, 2020 designating the United States of America, the entire disclosure of which is incorporated herein by reference.

The present application is based on and claims priority to Japanese Patent Application No. 2019-093555 filed on May 17, 2019, the disclosure of which is incorporated herein by reference.

TECHNICAL FIELD

The present disclosure relates to moving-object power supply systems, which is capable of wirelessly supplying power to traveling vehicles.

BACKGROUND

There is well known a wireless power supply system that wirelessly supplies electric power to various devices.

SUMMARY

In a moving-object power supply system according to a schematic aspect of the present disclosure, a control unit selects, as a power transmission segment, one of segments included in at least one power transmission section. The control unit supplies, through a power supply circuit, power to the power transmission segment to thereby generate a magnetic field through a power transmission coil of the power transmission segment. The control unit deter mines, based on an ascertained first electrical characteristic of the power transmission segment and an ascertained second electrical characteristic of at least one power non-transmission segment, whether there is a malfunction in each of the power transmission segment and the at least one power non-transmission segment.

BRIEF DESCRIPTION OF THE DRAWINGS

FIG. 2 is a circuit block diagram illustrating a schematic configuration of a power transmission section;

FIG. 12 is a circuit diagram illustrating a fourth assumed case where there is a short-circuit across a selected switching transistor, so that the selected switching transistor is always on;

DETAILED DESCRIPTION OF EMBODIMENTS

Figure 1:
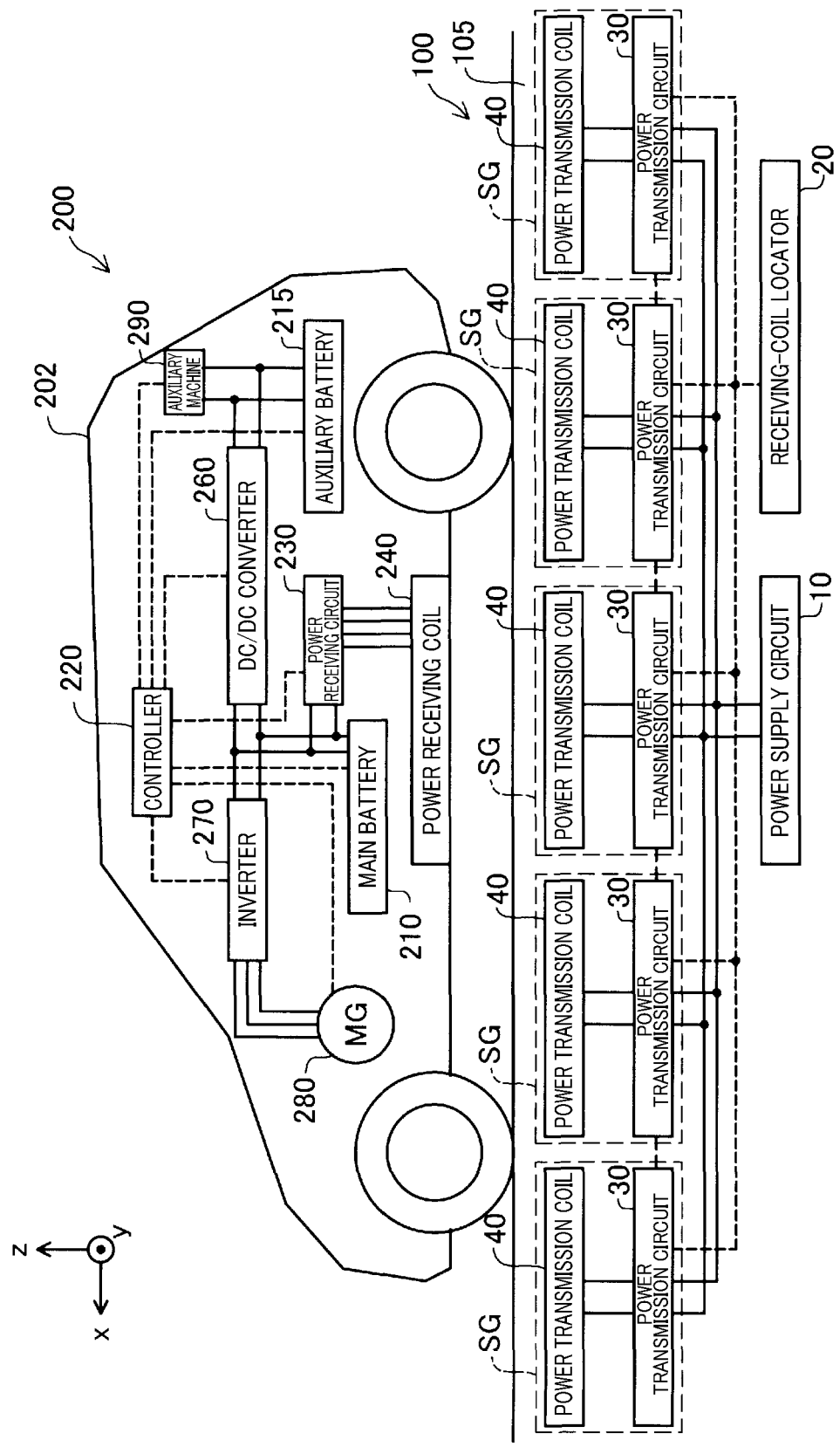
FIG. 1 is a circuit block diagram illustrating a moving-object power supply system.

Japanese Patent Application Publication No. 2017-70181 discloses a wireless power transfer system that wirelessly transfers electric power.

The wireless power transfer system includes an electric power control device, a power transmission device, a power relay device, and a power receiving device; the power transmission device, power relay device, and power receiving device are arranged in series. The power control device is comprised of a power receiving circuit and a main controller, and the relay device includes a relay power receiver and a load circuit.

The main controller generates a first load command, and transmits the first load command to the power transmission device through the relay power receiver of the relay device. The main controller also generates a second load command, and transmits the second load command to the load circuit.

In response to receiving the first load command through relay power receiver of the relay device, the power transmission device returns, to the main controller, a first response signal and voltage information indicative of a voltage value of alternating-current (AC) power to be supplied to the load circuit.

In response to receiving the second load command, the load circuit returns, to the main controller, a second response signal.

In response to determining that the main controller has not received the second response signal for a first period and the voltage information for a second period while determining that the main controller has received the first response signal, the main controller determines that the relay power receiver has malfunctioned while determining that the load circuit is operating normally.

The above patent publication merely discloses a method of specifying where there is a malfunction in the wireless power transfer system including the power transmission device, power relay device, and power receiving device arranged in series. That is, the method disclosed in the above patent publication may not be applied to a power supply system that mainly has a function of wirelessly supplying electric power to traveling vehicles.

An exemplary aspect of the present disclosure provides a moving-object power supply system provides a moving-object power supply system. The moving-object power supply system includes at least one power transmission section that includes a plurality of segments connected in parallel to one another in a traveling direction of a moving object. Each of the segments includes an inverter, a filter, a resonance circuit, and a power transmission coil. The moving-object power supply system includes a power supply circuit for power supply to each of the segments and a control unit.

The control unit is configured to

1. Select, as a power transmission segment, one of the segments included in the at least one power transmission section 2. Supply, through the power supply circuit, power to the power transmission segment to thereby generate a magnetic field through the power transmission coil of the power transmission segment 3. Ascertain a first electrical characteristic of the power transmission segment, the first electrical characteristic of the power transmission segment including a first current generated to flow through the power transmission coil of the power transmission segment and a first voltage generated across the power transmission coil of the power transmission segment 4. Ascertain a second electrical characteristic of at least one power non-transmission segment, the at least one power non-transmission segment being selected from the segments except for the power transmission segment, the second electrical characteristic of the at least one power non-transmission segment including a second current and a second voltage induced based on magnetic coupling of the power transmission coil of the at least one power non-transmission segment to the generated magnetic field 6. Determine, based on the first and second electrical characteristics, whether there is a malfunction in each of the power transmission segment and the at least one power non-transmission segment The above exemplary aspect of the present disclosure supplies the power to the power transmission segment to thereby ascertain the electrical characteristic of each of the power transmission segment and the at least one power non-transmission segment. This enables easy determination of whether there is a malfunction in which of the power transmission segment and the at least one power non-transmission segment.

Referring to FIG. 1, a wireless moving-object power supply system according to an exemplary embodiment includes a moving-object power supply system, which will also be simply referred to as a power supply system, 100 located on, in, or adjacent to a road 105, and a power receiving system 200 installed in or on a vehicle 202 that is traveling. The wireless power supply system is configured such that the power supply system 100 is capable of supplying power to the vehicle 202. The vehicle 202 is configured as an electric vehicle or a hybrid vehicle. In FIG. 1, an x-axis direction is defined as a traveling direction of the vehicle 202, a y-axis direction is defined as a width direction of the vehicle 202, and a z-axis direction is defined as an upper side of the vertical.

The power supply system 100 located on, in, or adjacent to the road 105 includes a plurality of power transmission coils 40, a plurality of power transmission circuits 30, a power supply circuit 10, and a receiving-coil locator 20.

The power supply circuit 10 supplies a direct-current (DC) voltage to each of the power transmission circuits 30. Each of the power transmission circuits 30 supplies an alternating-current (AC) voltage to a corresponding one of the power transmission coils 40.

The power transmission coils 40 are disposed in the x-axis direction. Each of the power transmission circuits 30 is configured to convert the DC voltage supplied from the power supply circuit 10 into a high-frequency AC voltage, and supply the converted AC voltage to a corresponding one of the power transmission coils 40. For example, each of the power transmission circuits 30 is comprised of an inverter 32, a filter 34, and a resonance circuit 36. Each of the transmission coils 40 and a corresponding one of the power transmission circuits 30 constitute a unit or a segment, which will be referred to as a segment SG.

The power supply circuit 10 is configured as, for example, an AC/DC converter configured to rectify a commercial AC voltage supplied from a commercial power source to thereby generate the DC voltage, and output the DC voltage to each of the power transmission circuits 30. Note that the DC voltage outputted from the power supply circuit 10 is not limited to a complete DC voltage with no ripples, and can be a substantial DC voltage with certain levels of ripples.

The receiving-coil locator 20 is configured to locate, i.e., track the location of, a power receiving coil 240 installed in the vehicle 202. For example, the receiving-coil locator 20 can be configured to locate the power receiving coil 240 in accordance with the magnitude of power or a current transmitted from each of the power transmission circuits 30. As another example, the receiving-coil locator 20 is configured to wirelessly communicate with the vehicle 202, thus tracking the location of the power receiving coil 240 or track the location of the power receiving coil 240 using a location sensor for monitoring the location of the vehicle 202.

At least one of the power transmission circuits 30 is configured to supply power to a corresponding at least one of the power transmission coils 40 when determining that the corresponding at least one of the power transmission coils 40 is located closer to the power receiving coil 240 located by the receiving-coil locator 20.

The vehicle 202 includes a main battery 210, an auxiliary battery 215, a controller 220, a power receiving circuit 230, the power receiving coil 240, a DC/DC converter 260, an inverter 270, a motor-generator 280, and auxiliary devices 290.

The power receiving coil 240 is connected to the power receiving circuit 230, and a pair of output terminals of the power receiving circuit 230 is connected to each of the main battery 210, a pair of high-side terminals of the DC/DC converter 260, and the inverter 270. A pair of low-side terminals of the DC/DC converter 260 is connected to the auxiliary battery 215 and the auxiliary devices 290. Terminals of the motor-generator 280 are connected to the inverter 270.

The power receiving coil 240 is configured to generate electromotive force, i.e., an AC voltage induced based on electromagnetic induction between the power receiving coil 240 and at least one of the transmission coils 40.

The power receiving circuit 230 includes a resonance circuit, a filter, and a rectifier that converts the AC voltage induced in the power receiving coil 240 into a DC voltage. The power receiving circuit 230 can include a DC/DC converter that converts the DC voltage generated by the rectifier into a corrected DC voltage that is suitable for charging the main battery 210. The DC voltage outputted from the power receiving circuit 230 can be used to charge the main battery 210 and/or drive the motor-generator 280 through the DC/DC converter 260. The DC/DC converter 260 can be configured to step down the DC volage outputted from the power receiving circuit 230, and the stepped-down DC voltage can be used to charge the auxiliary battery 215 and/or drive the auxiliary devices 290.

The main battery 210 is configured to output a relatively high DC voltage for driving the motor-generator 280.

The motor-generator 280 operates as a three-phase AC motor that generates drive power for causing the vehicle 202 to travel. In addition, the motor-generator 280 operates as a generator that generates a three-phase AC voltage while the vehicle 202 is decelerating.

The inverter 270 is configured to convert the DC voltage outputted from the main battery 210 into the three-phase AC voltage when the motor-generator 280 serves as a three-phase motor, thus supplying the three-phase AC voltage to the motor-generator 280. In addition, the inverter 270 is configured to convert the three-phase AC voltage generated by the motor-generator 280 into a DC voltage when the motor-generator 280 serves as a generator, thus supplying the DC voltage to the main battery 210.

The DC/DC converter 260 is configured to step down the DC voltage based on the main battery 210, and supply the stepped-down DC voltage to both the auxiliary battery 215 and auxiliary devices 290. The auxiliary battery 215 is configured to output a relatively low DC voltage for driving the auxiliary devices 290. The auxiliary devices 290 include various peripheral devices of the vehicle 202, such as an air-conditioner, an electric power-steering apparatus, headlights, direction indicators, and wipers, and various accessory devices of the vehicle 202.

The controller 220 is configured to control each unit included in the vehicle 202. The controller 220 is also configured to control the power receiving circuit 230 to thereby perform a power receiving operation in a wireless power receiving mode.

The power supply system 100 includes a plurality of power transmission sections SC. As illustrated in FIG. 2, each power transmission section SC includes a segment group comprised of a predetermined number of the segments SG connected in parallel to one another, and a power supply circuit 10. The power supply circuit 10 includes a rectifier 11 and a power-factor corrector (PFC) 12.

The rectifier 11 is configured to rectify commercial AC power supplied from a commercial power source 15 to power lines PL1 and PL2 to thereby generate DC power.

The power-factor corrector 12 is configured to suppress harmonic current components included in a rectified input current based on the commercial AC power to thereby adjust a power factor of the rectifier 11 to be closer to 1.

The power supply circuit 10 of each power transmission section SC according to the first embodiment is connected to a corresponding set of segments SG.

The power supply system 100 includes plural pairs of switches SW1. Each pair of switches SW1 is configured to enable power supply from the commercial power source 15 to a corresponding one of the power transmission sections SC, and disable power supply from the commercial power source 15 to a corresponding one of the power transmission sections SC.

Figure 3A:
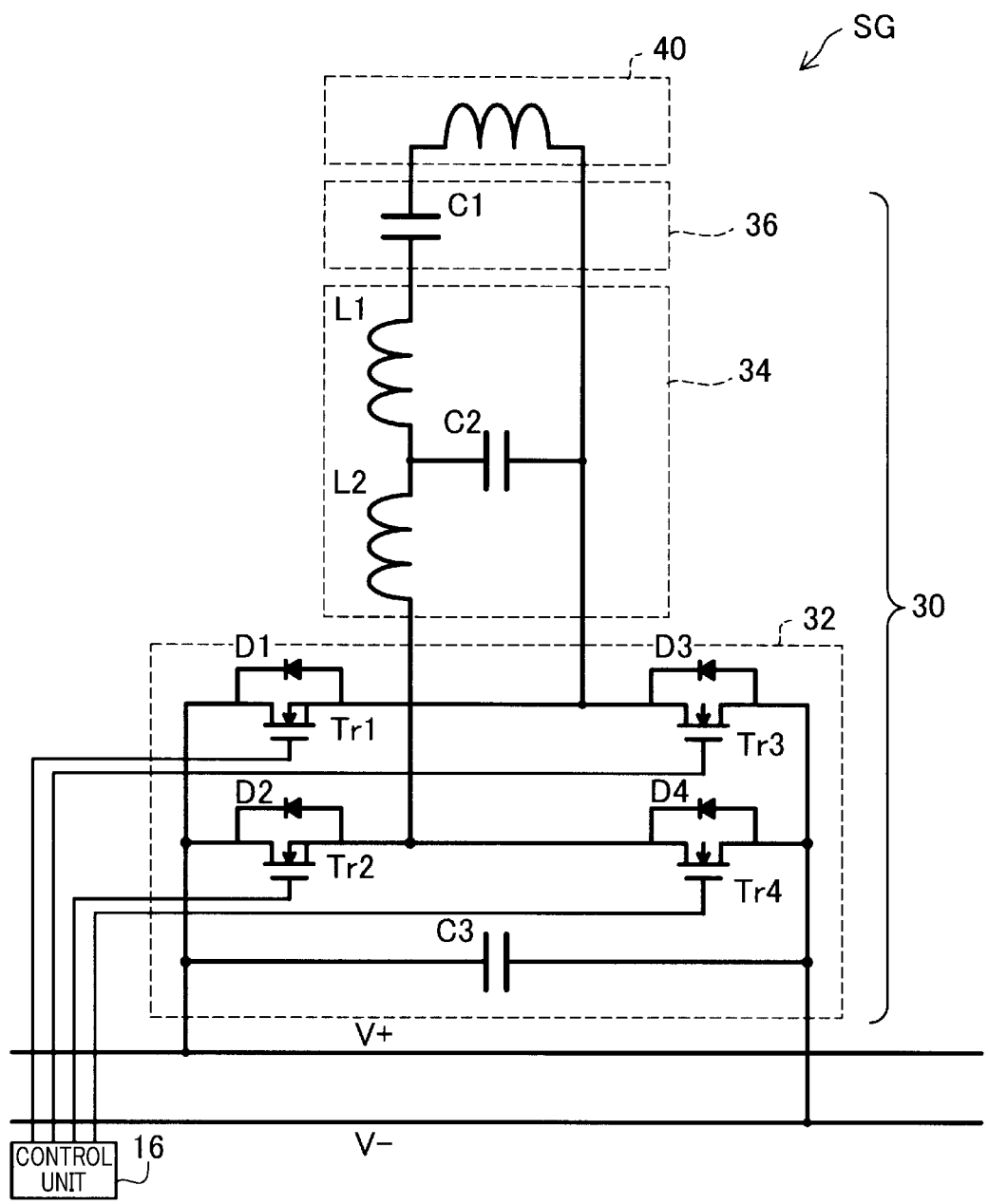
FIG. 3A is a circuit diagram illustrating a circuit configuration of a segment.

Each segment SG includes, as illustrated in FIG. 3A, the power transmission circuit 30 and the power transmission coil 40.

The power transmission circuit 30 is comprised of the inverter 32, the filter 34, and the resonance circuit 36.

The inverter 32 is comprised of four switching transistors Tr1, Tr2, Tr3, and Tr4, and a capacitor C3.

The four switching transistors Tr1 to Tr4 constitute an H bridge circuit. Specifically, the switching transistors Tr1 and Tr3 are connected in series, and the switching transistors Tr2 and Tr4 are connected in series.

The switching transistors Tr1 and Tr2 are connected to a positive power line V+, and the switching transistors Tr3 and Tr4 are connected to a negative power line V−.

The inverter 32 has a first intermediate node between the switching transistors Tr1 and Tr3, and has a second intermediate node between the switching transistors Tr2 and Tr4. The first and second intermediate nodes are connected to the filter 34. The capacitor C3 denotes a smoothing capacitor disposed between the positive power line V+ and the negative power line V−.

The filter 34 is designed as a T filter comprised of two inductors L1 and L2 and a capacitor C2.

The resonance circuit 36 is comprised of a capacitor C1 connected in series between the power transmission coil 40 and the inductor L1 of the filter 34.

Figure 3B:
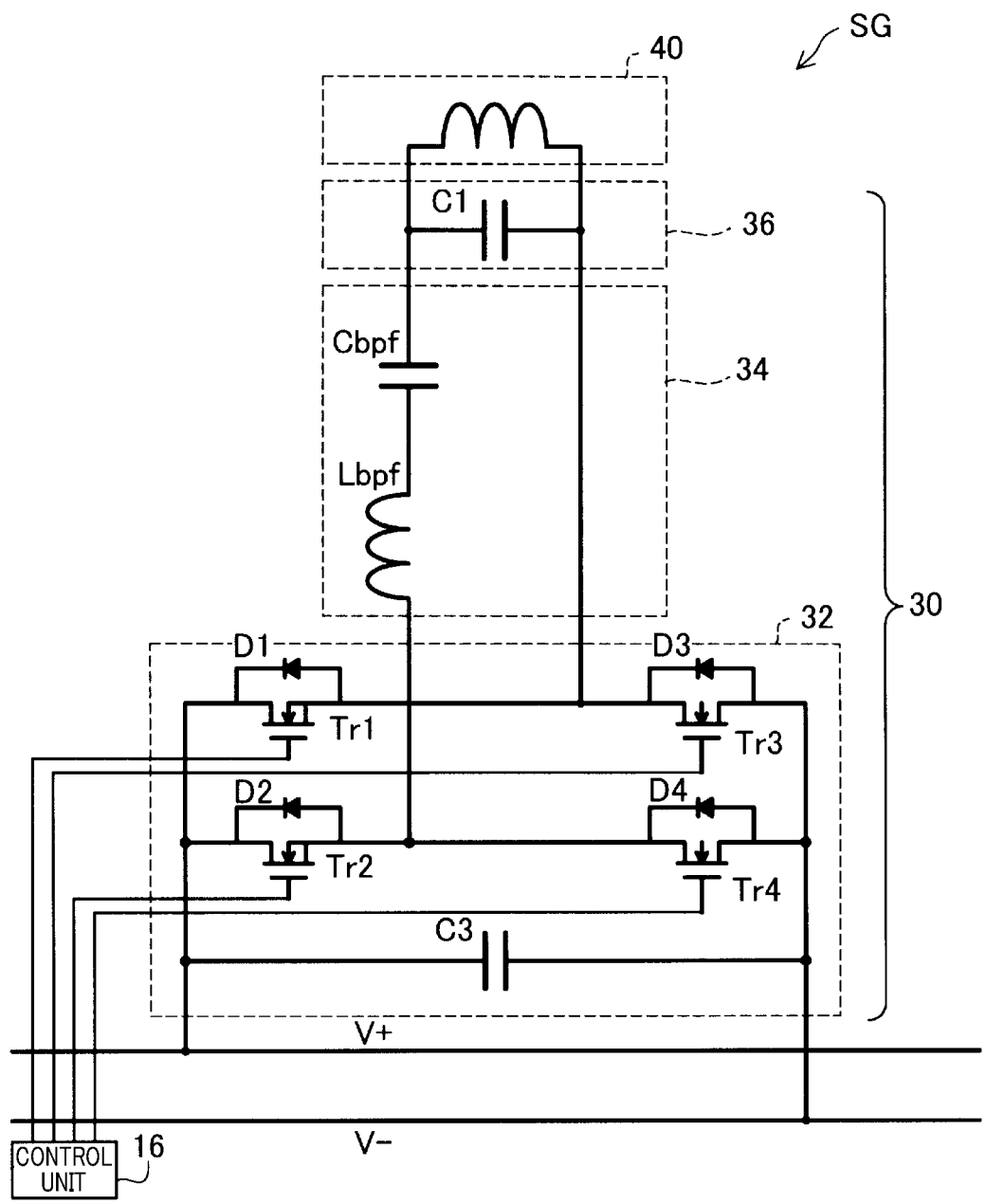
FIG. 3B is a circuit diagram illustrating a circuit configuration of a segment in which a resonance circuit is provided as a parallel circuit.

The resonance circuit 36 can be configured such that the capacitor C1 is, as illustrated in FIG. 3B, connected in parallel to the power transmission coil 40. The filter 34 according to this modification illustrated in FIG. 3B can be designed as a bandpass filter comprised of an inductor Lbpf and a capacitor Cbpf connected in series.

The power supply system 100 includes a control unit 16.

The control unit 16 is configured to control on-off operations of the respective switching transistors Tr1 to Tr4. Specifically, the control unit 16 is configured to complementarily 1. Turn on the switching transistors Tr1 and Tr4 while holding the switching transistors Tr2 and Tr3 in an off state 2. Turn on the switching transistors Tr2 and Tr3 while holding the switching transistors Tr1 and Tr4 in the off state When one of the segments SG becomes a power non-transmission segment described later, all the switching transistors Tr1 to Tr4 are in the off state.

Figure 4:
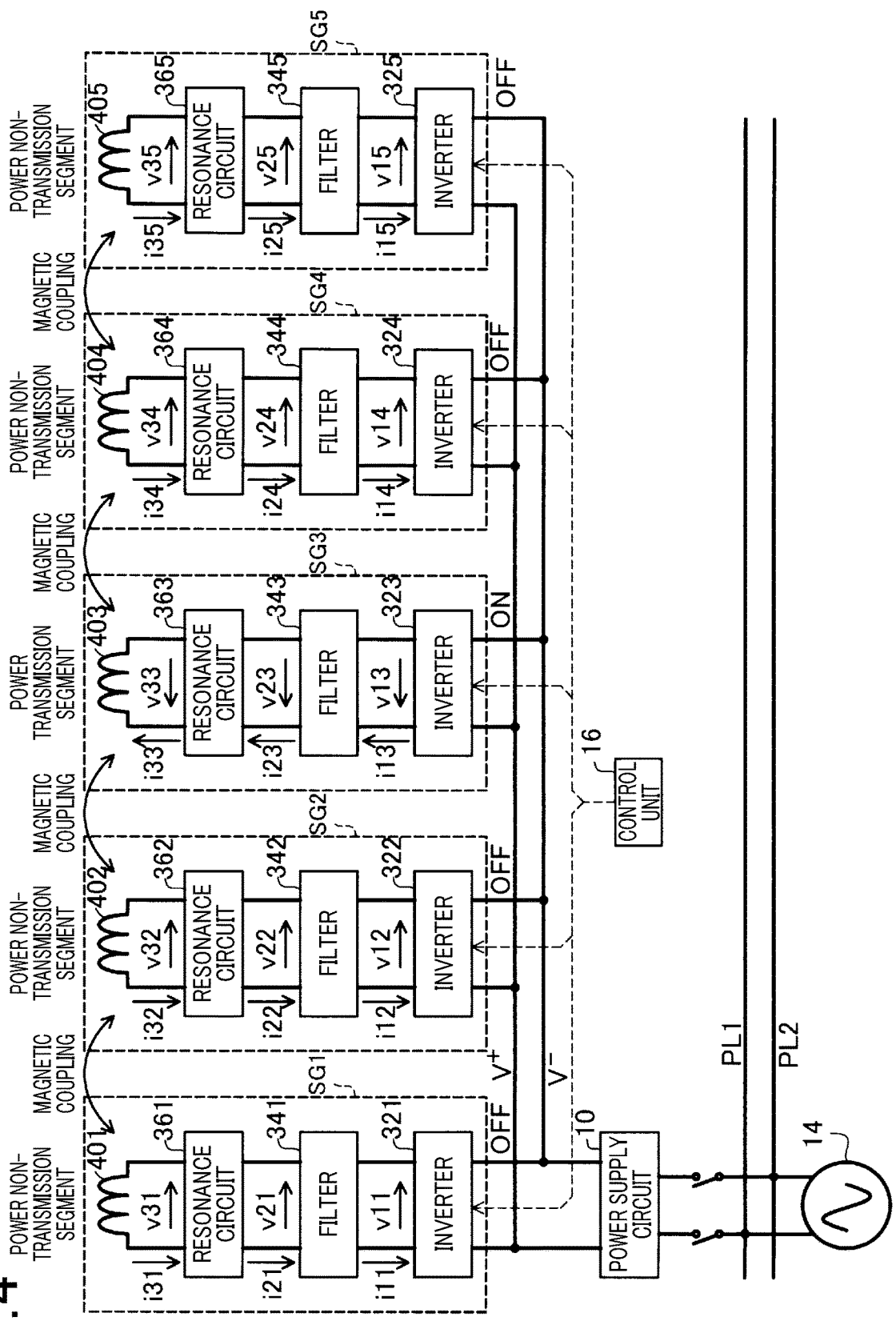
FIG. 4 is a circuit block diagram illustrating a power transmission segment and power non-transmission segments.

The segments SG included in each section SC are, as illustrated in FIG. 4, separated into one power transmission segment and other power non-transmission segments.

One of the segments SG, which is selected as the one power transmission segment from all the segments SG, is controlled to be powered, i.e., turned on.

FIG. 4 illustrates an example where five segments SG1, SG2, SG3, SG4, and SG5 are included in each section SC, and the segment SG3 is selected as the one power transmission segment.

The other segments SG except for the one power transmission segment in each section SC respectively denote the power non-transmission segments are controlled not to be powered, i.e., turned off. In the example illustrated in FIG. 4, the segments SG1, SG2, SG4, and SG5 respectively denote the power non-transmission segments.

When distinguishing a selected one segment SG from the remaining other segments SG, we distinctively describe the selected one segment SG with a selected numerical subscript, such as SGn; n is a natural number. This can also be applied to other components.

When power is transmitted to the segment SG3 serving as the power transmission segment, the transmitted power causes a voltage V13 to be applied across the inverter 323, a voltage V23 to be applied across the filter 343, and a voltage V33 to be applied across the resonance circuit 363. This results in the inverter 323 outputting a current I13, the filter 343 outputting a current I23, and the resonance circuit 363 outputting a current I33. The last numeral of a reference sign attached to each of the currents and voltages represents the last numeral 3 of the reference sign attached to the segment SG3.

The power transmission coil 403 of the segment SG3 serving as the power transmission segment is magnetically coupled to the power transmission coils 402 and 404 of the respective segments SG2 and SG4 that serve as power non-transmission segments adjacent to the power transmission segment SG3. The power transmission coil 402 of the segment SG2 is magnetically coupled to the power transmission coils 401 and 403 of the respective segments SG1 and SG3. The power transmission coil 404 of the segment SG4 is magnetically coupled to the power transmission coils 403 and 405 of the respective segments SG3 and SG5.

For the above magnetic coupling configuration, supplying AC power to the power transmission coil 403 of the segment SG3, i.e., the power transmission segment SG3, causes a voltage V32 to be induced in the power transmission coil 402 of the adjacent segment SG2, i.e., the adjacent power non-transmission segment SG2, and a voltage V34 to be induced in the power transmission coil 404 of the adjacent segment SG4, i.e., the adjacent power non-transmission segment SG4. This results in an induced current I32 flowing through the power transmission coil 402 and an induced current I34 flowing through the power transmission coil 404.

This also causes a voltage V31 to be induced in the power transmission coil 401 of the segment SG1, i.e., the power non-transmission segment SG1, adjacent to the segment SG2, and a voltage V35 to be induced in the power transmission coil 405 of the segment SG5, i.e., the power non-transmission segment SG5, adjacent to the segment SG4. This results in an induced current I31 flowing through the power transmission coil 401 and an induced current I35 flowing through the power transmission coil 405.

That is, the voltage induced in each of the power transmission coils 401, 402, 404, and 405 causes a corresponding one of the induced currents I31, I32, I34, and I35 to flow through a corresponding one of the resonance circuits 361, 362, 364, and 365. The induced currents I31, I32, I34, and I35 flowing through the respective resonance circuits 361, 362, 364, and 365 cause currents I21, I22, I24, and I25 to flow through the respective filters 341, 342, 344, and 345. This results in voltages V21, V22, V24, and V25 to be applied across the respective filters 341, 342, 344, and 345.

This causes the currents I11, I12, I14, and I15 to flow through the respective inverters 321, 322, 324, and 325, so that the voltages V11, V12, V14, and V15 are applied across the respective inverters 321, 322, 324, and 325.

The control unit 16 is configured to measure the above currents and/or the above voltages to thereby determine whether each segment SGn is in a normal state or a malfunction state (anormal state). In response to determination that at least one segment is in the malfunction state, the control unit 16 is capable of locating which of the segments SGn is in the malfunction state, and also locating which of the circuits has malfunctioned in the located malfunctioning segment.

Figure 5:
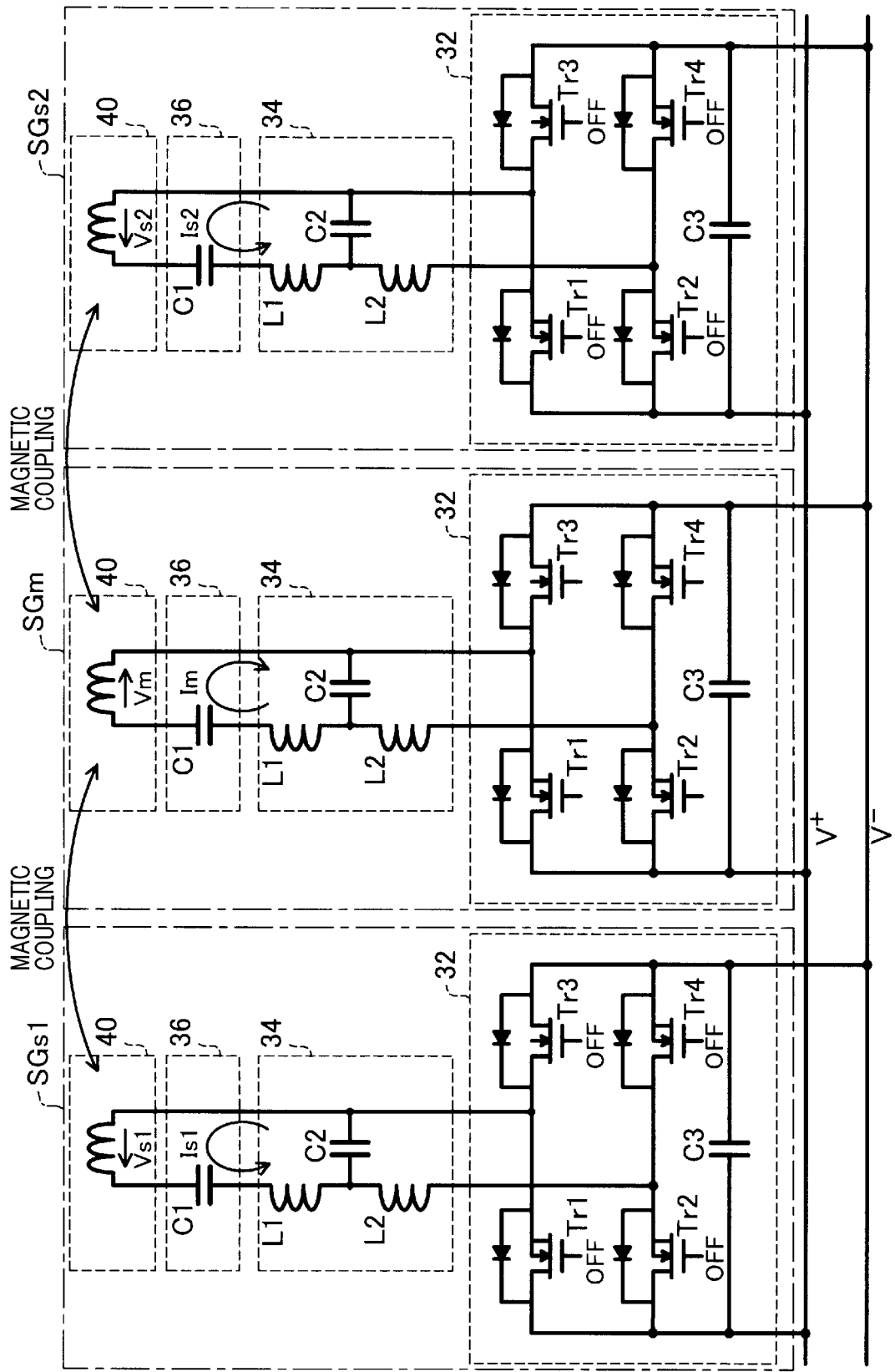
FIG. 5 is a circuit diagram illustrating magnetic coupling between the power transmission segment and each of the power non-transmission segments, and a resonance of each of the segments.

The following describes, using FIG. 5, (i) the magnetic coupling between a selected power transmission segment SGm and each of adjacent power non-transmission segments SGs1 and SGs2, and (ii) resonance of each of the segments SGm, SGs1, and SGs2.

The segment SGm is selected from all the segments SGn, and the power non-transmission segments SGs1 and SGs2 are located adjacent to the segment SGm.

Resonance conditions of the power transmission segment SGm can be for example represented by the following expressions (1) to (3):

$$\omega = 2\pi f \tag{1}$$

$$\omega Lt = 1/(\omega Ct) \tag{2}$$

$$\omega Limi = 1/(\omega Cimi) \tag{3}$$

where:
f denotes an operation frequency of the inverter 32;
ω denotes an operation angular frequency of the inverter 32;
Lt denotes an inductance of the power transmission coil 40;
Ct denotes a capacitance of the capacitor C1 of the resonance circuit 36;
Limi denotes an inductance of each of the inductors L1 and L2 of the filter 34; and
Cimi denotes a capacitance of the capacitor C2 of the filter 34.

Magnetic coupling between the power transmission coil 40 of the selected power transmission segment SGm and the power transmission coil 40 of the power non-transmission segment SGs1 causes a current Im supplied to flow through the power transmission coil 40 of the selected power transmission segment SGm to induce a current Ist1 flowing through the power transmission coil 40 of the power non-transmission segment SGs1. This results in a voltage Vs1 being applied across the resonance circuit 36 of the power non-transmission segment SGs1.

Similarly, magnetic coupling between the power transmission coil 40 of the selected power transmission segment SGm and the power transmission coil 40 of the power non-transmission segment SGs2 causes the current Im supplied to flow through the power transmission coil 40 of the selected power transmission segment SGm to induce a current Ist2 flowing through the power transmission coil 40 of the power non-transmission segment SGs2. This results in a voltage Vs2 being applied across the resonance circuit 36 of the power non-transmission segment SGs2.

Figure 6:
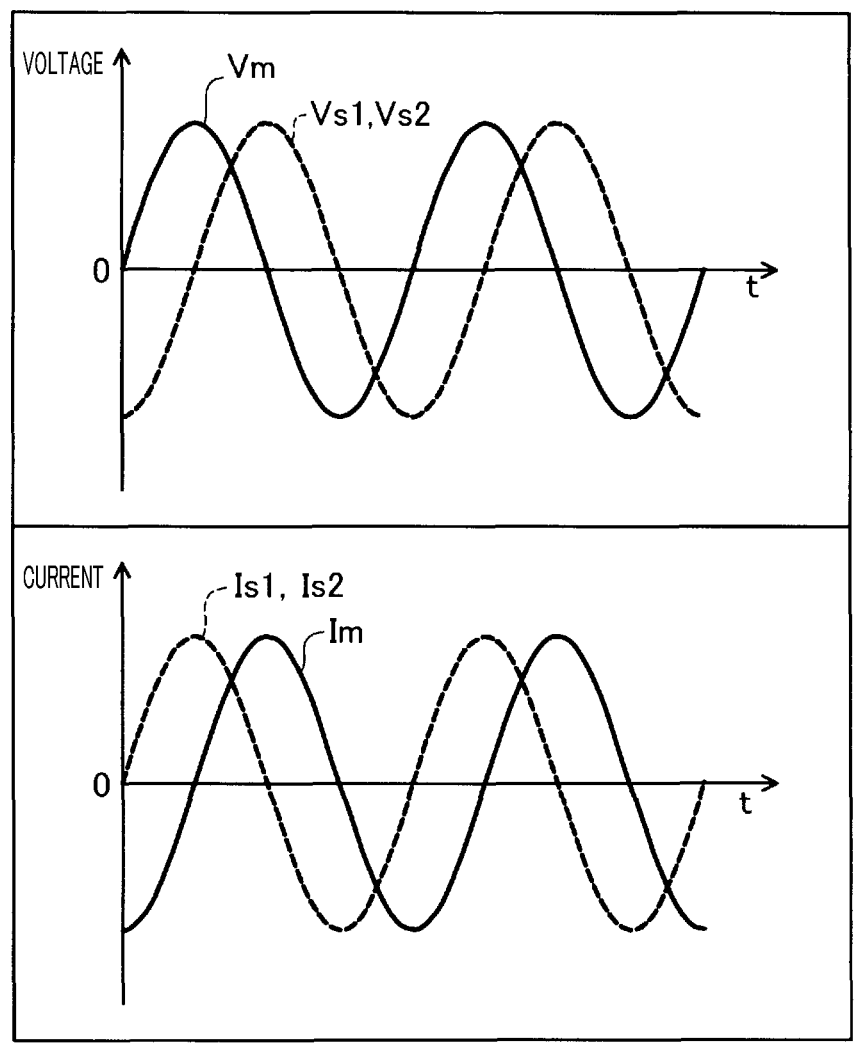
FIG. 6 is a set of graphs illustrating simulation results of (i) a current and a voltage generated in the power transmission segment that is in a normal state and (ii) a current and a voltage generated in each of the power non-transmission segment that is in the normal state.

FIG. 6 is a set of graphs illustrating simulation results of
1. The voltage Vm applied to the selected power transmission segment SGm that is in the normal state
2. The voltage Vs1 induced in the power non-transmission segment SGs1 that is in the normal state 3. The voltage Vs2 induced in the power non-transmission segment SGs2 that is in the normal state 4. The current Im flowing in the selected power transmission segment SGm that is in the normal state 5. The current Is1 induced in the power non-transmission segment SGs1 that is in the normal state 6. The current Is2 induced in the power non-transmission segment SGs2 that is in the normal state As illustrated in FIG. 6, each of the voltages Vs1 and Vs2 induced in a corresponding one of the power non-transmission segments SGs1 and SGs2 has a phase delay of $\pi/2$ with respect to the voltage Vm applied to the power transmission segment SGm. Additionally, each of the currents Is1 and Is2 induced in a corresponding one of the power non-transmission segments SGs1 and SGs2 has a phase advance of $\pi/2$ with respect to the current Im applied to the power transmission segment SGm.

This makes it possible for the control unit 16 to

1. Drive the selected power transmission segment SGm

2. Measure the voltages Vm, Vs1, and Vs2 and the currents Im, Is1, and Is2

3. Determine, based on the measured voltages Vm, Vs1, and Vs2 and currents Im, Is1, and Is2, whether there is a malfunction in which of the segments SGm, SGs1, and SGs2

The simulation results illustrated in the set of graphs in FIG. 6 were computed assuming no loss. Other simulation results described later were computed assuming no loss.

Figure 7:
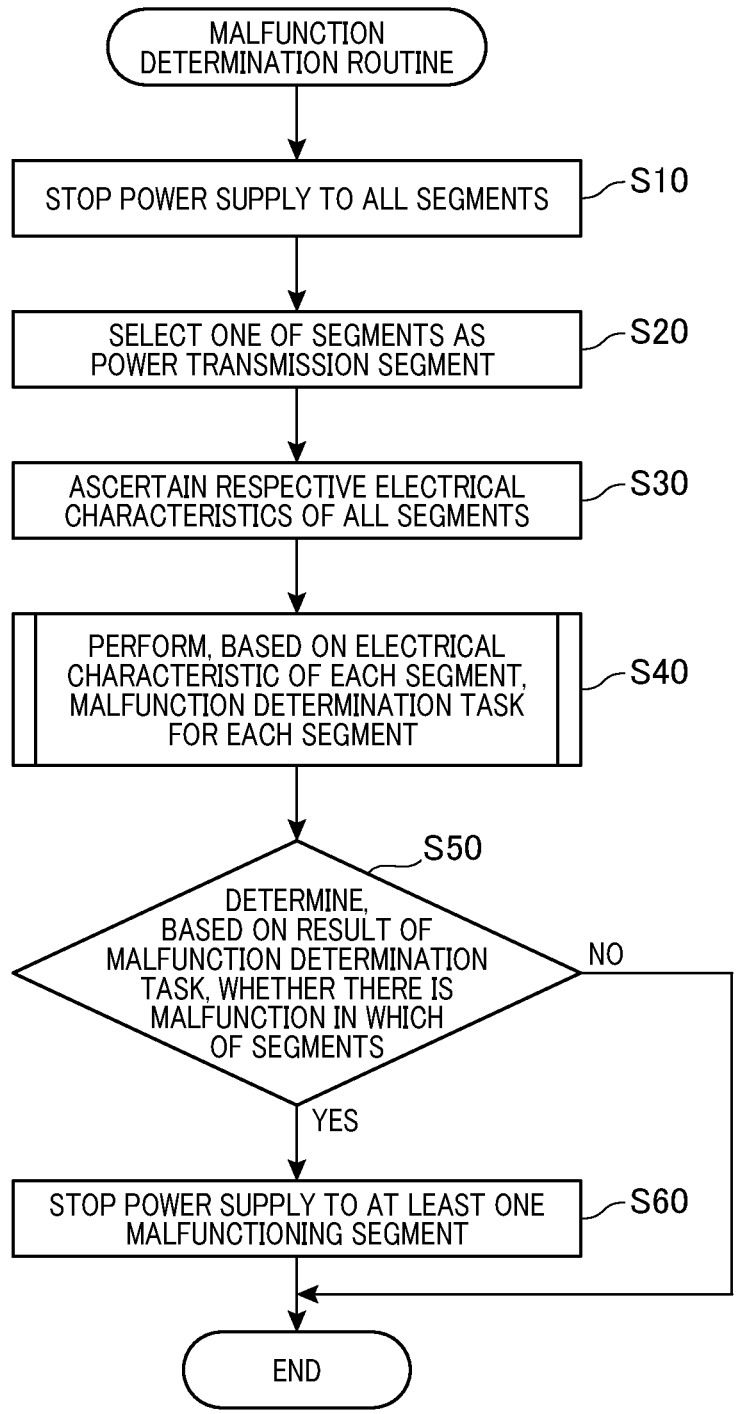
FIG. 7 is a flowchart illustrating a malfunction determination routine for the segments, which is executed by a control unit for every predetermined period.

FIG. 7 is a flowchart illustrating a malfunction determination routine for the segments SG of a selected section SC; the control unit 16 is programmed to execute the malfunction determination routine every predetermined period. Any controller or control unit, which is has a higher level than the control unit in a hierarchical structure, can execute the malfunction determination routine.

When starting the malfunction determination routine for the segments SG of a selected section SC, the control unit 16 stops power supply through the power transmission circuit 10 to all the segments SG of the selected section SC in step S10. If a vehicle is located to face the selected section SC and is receiving power from the selected section SC, the control unit 16 terminates the malfunction determination routine without stopping power supply to all the segments SG of the selected section SC, i.e., without turning off the selected section SC, thus continuously supplying power from all the segments SG of the selected section SC to the vehicle.

In other words, the control unit 16 executes the operations of the malfunction determination routine from step S10 only when there are no vehicles receiving power from the selected section SC.

If there is one or more vehicles receiving power from the selected section SC, the control unit 16 can be programmed to perform the operation of the malfunction determination routine from step S10 after there are no vehicles receiving power from the selected section SC. Alternatively, the control unit 16 can be programmed to perform the operation of the malfunction determination routine from step S10 after a predetermined time has elapsed since determination that there is one or more vehicles receiving power from the selected section SC.

Following the operation in step S10, the control unit 16 selects, in the selected section SC, one of the segments SG as the power transmission segment SGm, and selects a pair of segments located adjacent to the power transmission segment SGm in the selected section SC as a pair of the power non-transmission segments SGs1 and SGs2 in step S20. Then, in step S20, the control unit 16 drives or activates the selected segment, i.e., the selected power transmission segment, SGm in the selected section SC.

As illustrated in FIG. 5, magnetic coupling between the power transmission coil 40 of the driven power transmission segment SGm and the power transmission coil 40 of each of the power non-transmission segments SGs1 and SGs2, which are adjacent to the power transmission segment SGm, causes 1. The current Is1 to flow through the power transmission coil 40 and resonance circuit 36 of the power non-transmission segment SGs1, so that the voltage Vs1 is applied across the power transmission coil 40 and the resonance circuit 36 of the power non-transmission segment SGs1

2. The current Is2 to flow through the power transmission coil 40 and resonance circuit 36 of the power non-transmission segment SGs2, so that the voltage Vs2 is applied across the power transmission coil 40 and the resonance circuit 36 of the power non-transmission segment SGs2

Next, the control unit 16 obtains electrical characteristics of each of the segments SG included in the selected section SC in step S30.

For example, the control unit 16 obtains, from the power transmission segment SGm, the electrical characteristics including (i) the current Im flowing through the power transmission coil 40 and (ii) the voltage Vm applied across the resonance circuit 36 in step S30. Similarly, the control unit 16 obtains, from the power non-transmission segment SGs1, the electrical characteristics including (i) the current Is1 flowing through the power transmission coil 40 and the voltage Vs1 applied across the resonance circuit 36 in step S30. Additionally, the control unit 16 obtains, from the power non-transmission segment SGs2, the electrical characteristics including (i) the current Is2 flowing through the power transmission coil 40 and the voltage Vs2 applied across the resonance circuit 36 in step S30.

Specifically, reference character I and an index m attached thereto represent the current in the power transmission segment SGm, and reference character V and the index m attached thereto represent the volage in the power transmission segment SGm. Similarly, reference character I and an index s1 attached thereto represent the current in the power non-transmission segment SGs1, and reference character V and the index s1 attached thereto represent the volage in the power non-transmission segment SGs1. Additionally, reference character I and an index s2 attached thereto represent the current in the power non-transmission segment SGs2, and reference character V and the index s2 attached thereto represent the volage in the power non-transmission segment SGs2.

That is, the selected one of the indexes m, s1, and s2 attached to the voltage V identifies which of the segments SG the voltage V is applied in, and the selected one of the indexes m, s1, and s2 attached to the current I identifies which of the segments SG the current I flows in.

The control unit 16 performs, based on the electrical characteristics of each of the segments SG included in the selected section SC, a malfunction determination task for each of the segments SG in step S40. How the control unit 16 performs, based on the electrical characteristics of each of the segments SG included in the selected section SC, the malfunction determination task for each of the segments SG will be described later with examples.

Subsequently, the control unit 16 determines, based on a result of the malfunction determination task, whether there is a malfunction in which of the segments SG in step S50.

In response to determination that there is a malfunction in at least one segment SG, i.e., at least one malfunctioning segment SG, in the segments SG (YES in step S50), the malfunction determination routine proceeds to step S60.

Otherwise, in response to determination that there are no malfunctions in any of the segments SG (NO in step S50), the control unit 16 terminates the malfunction determination routine.

Next, the control unit 16 stops power supply through the power transmission circuit 10 to the at least one malfunctioning segment SG in step S60. The control unit 16 can be programmed to stop power supply to the selected section SC including the at least one malfunctioning segment SG in step S60. In step S60, the control unit 16 can be programmed to output warnings indicative of the at least one malfunctioning segment SG without stopping power supply to the at least one malfunctioning segment SG or the selected section SC including the at least one malfunctioning segment SG.

The following describes malfunction examples in at least one segment SG that can be determined in step S40 of the control unit 16:

1. A ground fault, a short-circuit fault, and/or an open fault for at least one of the switching transistors Tr1 to Tr4 and the smoothing capacitor C3

2. A ground fault, a short-circuit fault, and/or an open fault for at least one of the inductors L1 and L2 and the capacitor C2 of the filter 34

3. A ground fault, a short-circuit fault, and/or an open fault for the capacitor C1 of the resonance circuit 36

4. A ground fault, a short-circuit fault, and/or an open fault for the power transmission coil 40

The control unit 16 need not determine whether there are all these faults, i.e., malfunctions, in each of the segments SG, and can be programmed to determine whether there is at least one of a ground fault, a short-circuit fault, and an open fault for at least one of the inverter 32, filter 34, resonance circuit 36, and power transmission coil 40 of each of the segments SG.

The following describes simulation results of the electrical characteristics of the segments SGs1, SGs2, and SGm for each of assumed cases where a corresponding assumed malfunction has occurred in at least one of the segments SGs1, SGs2, and SGm.

Figure 8:
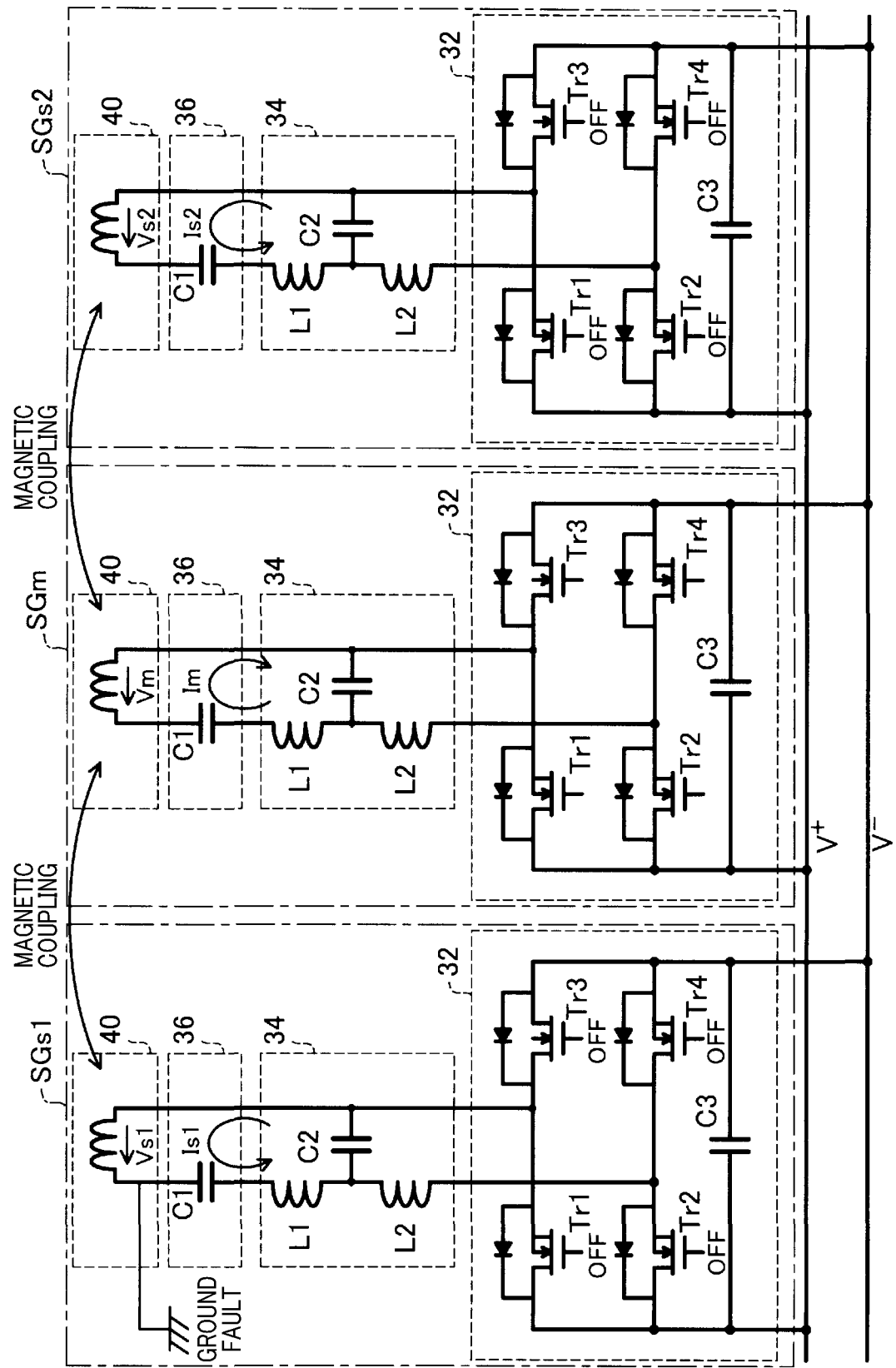
FIG. 8 is a circuit diagram illustrating a first assumed case where there is a ground fault in a power transmission coil of a selected power non-transmission segment.

FIG. 8 illustrates a first assumed case where there is a ground fault in the power transmission coil 40 of the power non-transmission segment SGs1; such a ground fault represents that a part of the power transmission coil 40 is short-circuited to a ground potential of the power non-transmission segment SGs1.

Figure 9:
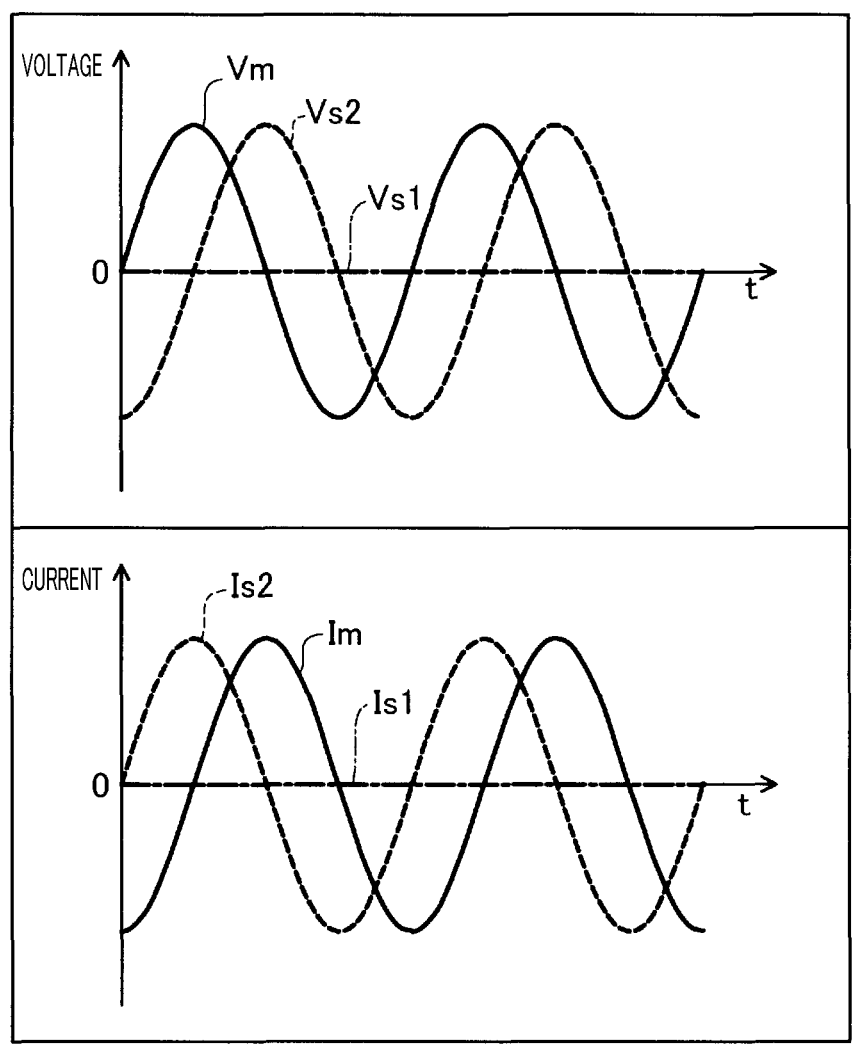
FIG. 9 is a set of graphs illustrating simulation results of electrical characteristics of the power transmission segment and power non-transmission segments for the first assumed case.

FIG. 9 is a set of graphs illustrating simulation results of the electrical characteristics of the segments SGs1, SGs2, and SGm for the first assumed case.

Specifically, as illustrated in FIG. 9, the voltage Vs1 induced in the power non-transmission segment SGs1 whose power transmission coil 40 is short-circuited to the ground potential becomes zero, so that the current Is1 induced in the power non-transmission segment SGs1 becomes zero. In contrast, the voltage Vs2 induced in the power non-transmission segment SGs2 whose power transmission coil 40 is not short-circuited to the ground potential is unchanged irrespective of the occurrence of a ground fault, so that the current Is2 induced in the power non-transmission segment SGs2 is unchanged irrespective of the occurrence of a ground fault.

In accordance with the above electrical characteristics, the control unit 16 performs 1. A first comparison of each of the voltages Vs1 and Vs2 with an allowable voltage range previously determined for a corresponding one of the voltages Vs1 and Vs2

2. A second comparison of each of the currents Is1 and Is2 with an allowable current range previously determined for a corresponding one of the currents Is1 and Is2

Performing the first and second comparisons make it possible to determine that there is a malfunction in the power non-transmission segment SGs1.

Figure 10:
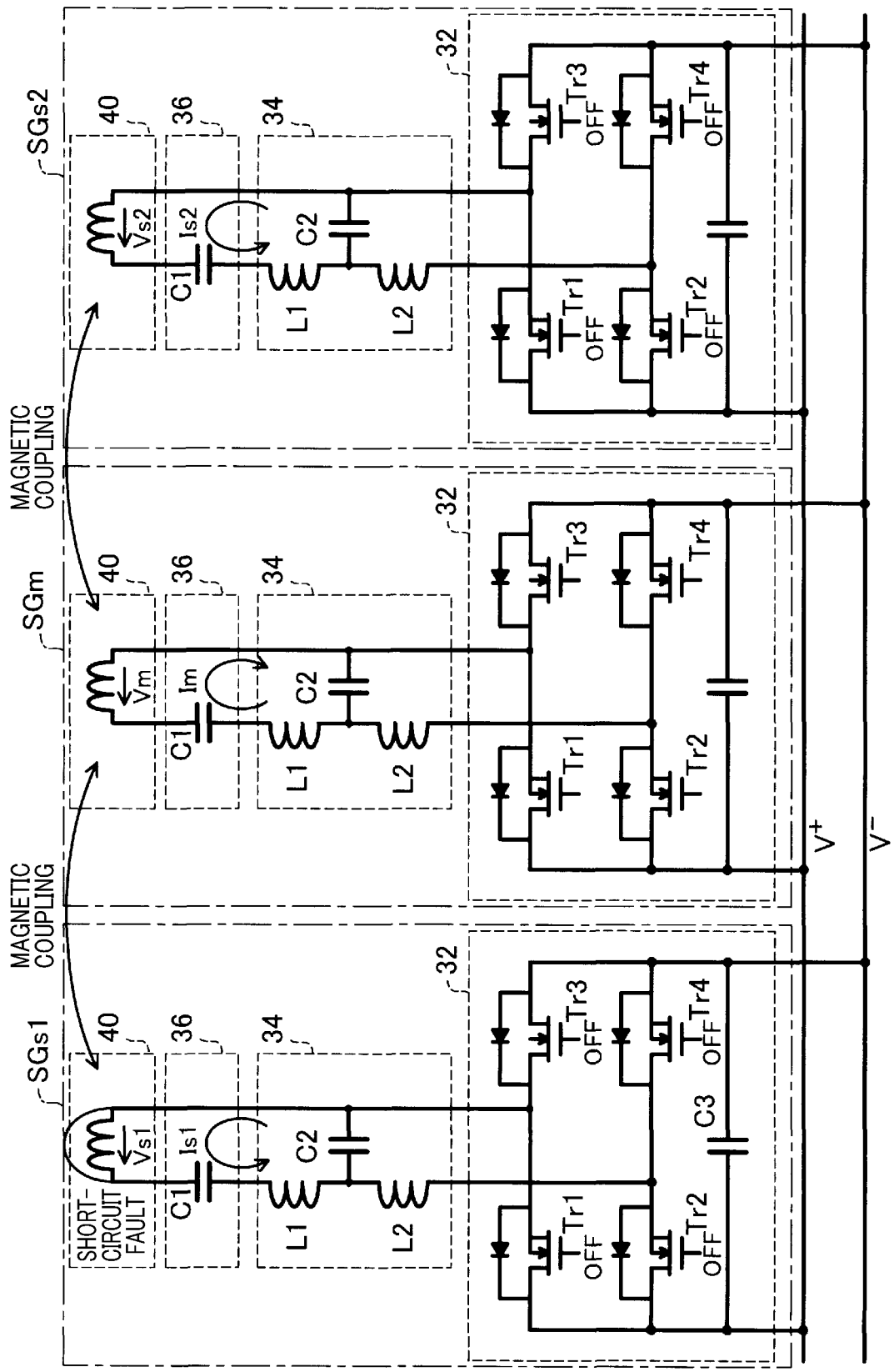
FIG. 10 is a circuit diagram illustrating a second assumed case where there is a short-circuit fault in the power transmission coil of the selected power non-transmission segment.

FIG. 10 illustrates a second assumed case where there is a short-circuit fault in the power transmission coil 40 of the power non-transmission segment SGs1; such a short-circuit fault represents a short-circuit across the power transmission coil 40 of the power non-transmission segment SGs1.

Simulation results of the electrical characteristics of the segments SGs1, SGs2, and SGm for the second assumed case are identical to those illustrated in FIG. 9 for the first assumed case.

Specifically, as illustrated in FIG. 9, the voltage Vs1 induced in the power non-transmission segment SGs1 with the short-circuit across the power transmission coil 40 thereof, so that the current Is1 induced in the power non-transmission segment SGs1 becomes zero. In contrast, the voltage Vs2 induced in the power non-transmission segment SGs2 with no short-circuit of the power transmission coil 40 is unchanged irrespective of the occurrence of a short-circuit fault, so that the current Is2 induced in the power non-transmission segment SGs2 is unchanged irrespective of the occurrence of a ground fault.

In accordance with the above electrical characteristics, the control unit 16 performs 1. A first comparison of each of the voltages Vs1 and Vs2 with the allowable voltage range previously determined for a corresponding one of the voltages Vs1 and Vs2

2. A second comparison of each of the currents Is1 and Is2 with the allowable current range previously determined for a corresponding one of the currents Is1 and Is2

Performing the first and second comparisons make it possible to determine that there is a malfunction in the power non-transmission segment SGs1.

Figure 11:
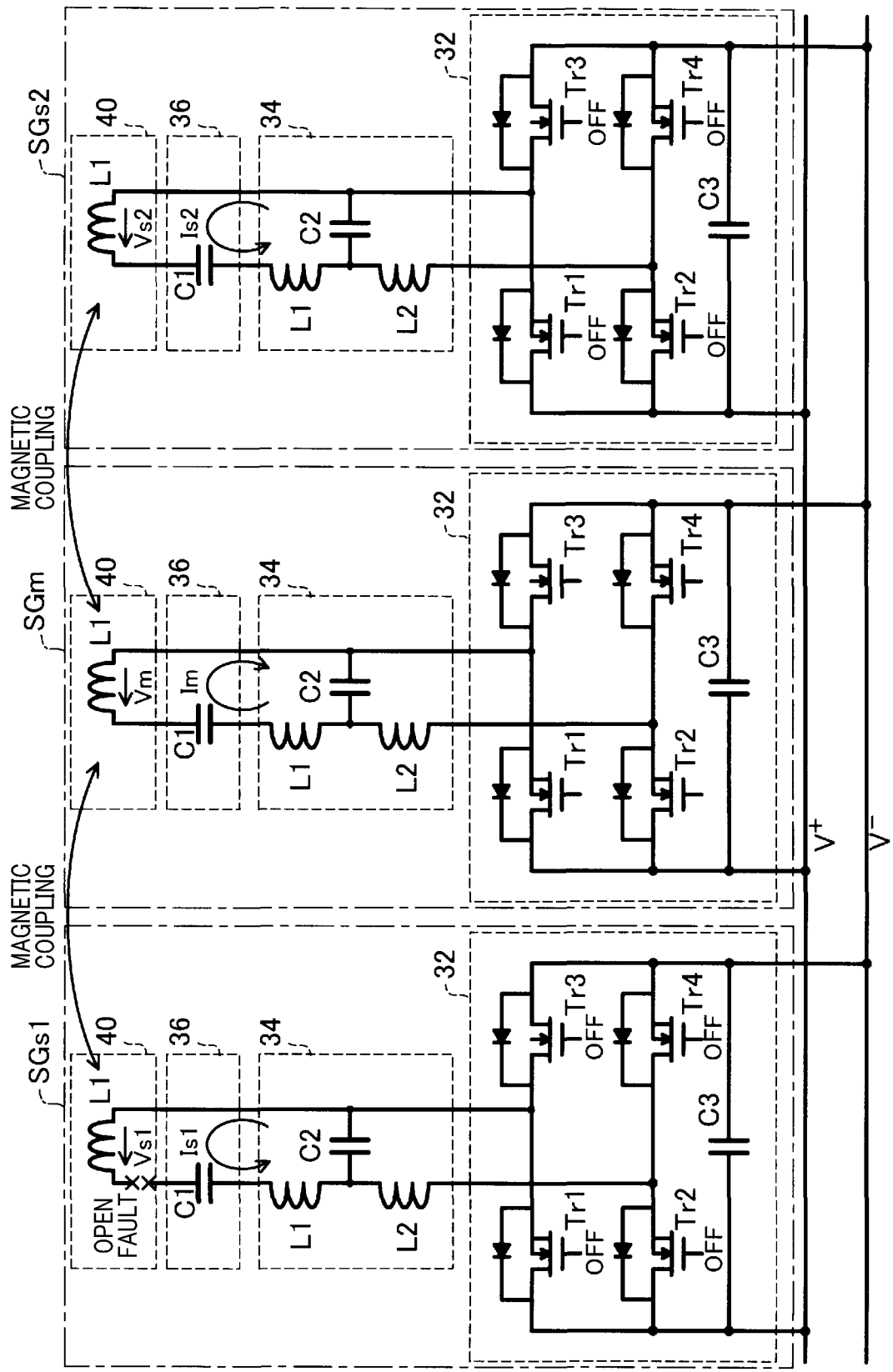
FIG. 11 is a circuit diagram illustrating a third assumed case where there is an open fault for the power transmission coil of the selected power non-transmission segment.

FIG. 11 illustrates a third assumed case where there is an open fault for the power transmission coil 40 of the power non-transmission segment SGs1.

Simulation results of the electrical characteristics of the segments SGs1, SGs2, and SGm for the third assumed case are identical to those illustrated in FIG. 9 for the first assumed case.

Specifically, as illustrated in FIG. 9, the voltage Vs1 induced in the power non-transmission segment SGs1 with an open fault for the power transmission coil 40 thereof, so that the current Is1 induced in the power non-transmission segment SGs1 becomes zero. In contrast, the voltage Vs2 induced in the power non-transmission segment SGs2 with no open fault for the power transmission coil 40 is unchanged irrespective of the occurrence of an open fault, so that the current Is2 induced in the power non-transmission segment SGs2 is unchanged irrespective of the occurrence of an open fault.

In accordance with the above electrical characteristics, the control unit 16 performs 1. A first comparison of each of the voltages Vs1 and Vs2 with the allowable voltage range previously determined for a corresponding one of the voltages Vs1 and Vs2

2. A second comparison of each of the currents Is1 and Is2 with the allowable current range previously determined for a corresponding one of the currents Is1 and Is2

Performing the first and second comparisons make it possible to determine that there is a malfunction in the power non-transmission segment SGs1.

As described above, an assumption of the occurrence of a malfunction, such as a ground fault, a short-circuit fault, or an open fault, for the power transmission coil 40 of the power non-transmission segment SGs1 results in the simulated current Is1 induced in the segment SGs1 becoming zero and the simulated voltage Vs1 induced in the segment SGs1 becoming zero. This therefore enables the occurrence of a malfunction in the power transmission coil 40 of the power non-transmission segment SGs1 to be determined. This can be established for an assumption of the occurrence of an assumed malfunction in the power transmission coil 40 of the power non-transmission segment SGs2.

Thus, determining that the current Is1 or Is2 is lower than the corresponding allowable current range enables the occurrence of any one of a ground fault, a short-circuit fault, and an open fault in the power non-transmission segment SGs1 or power non-transmission segment SGs2 to be determined. Similarly, determining that the voltages Vs1 or Vs2 is lower than the corresponding allowable voltage range enables the occurrence of any one of a ground fault, a short-circuit fault, and an open fault in the power non-transmission segment SGs1 or power non-transmission segment SGs2 to be determined.

Next, the following describes an assumption where there is a malfunction in the inverter 32 of the power non-transmission segment SGs1.

Figure 12:
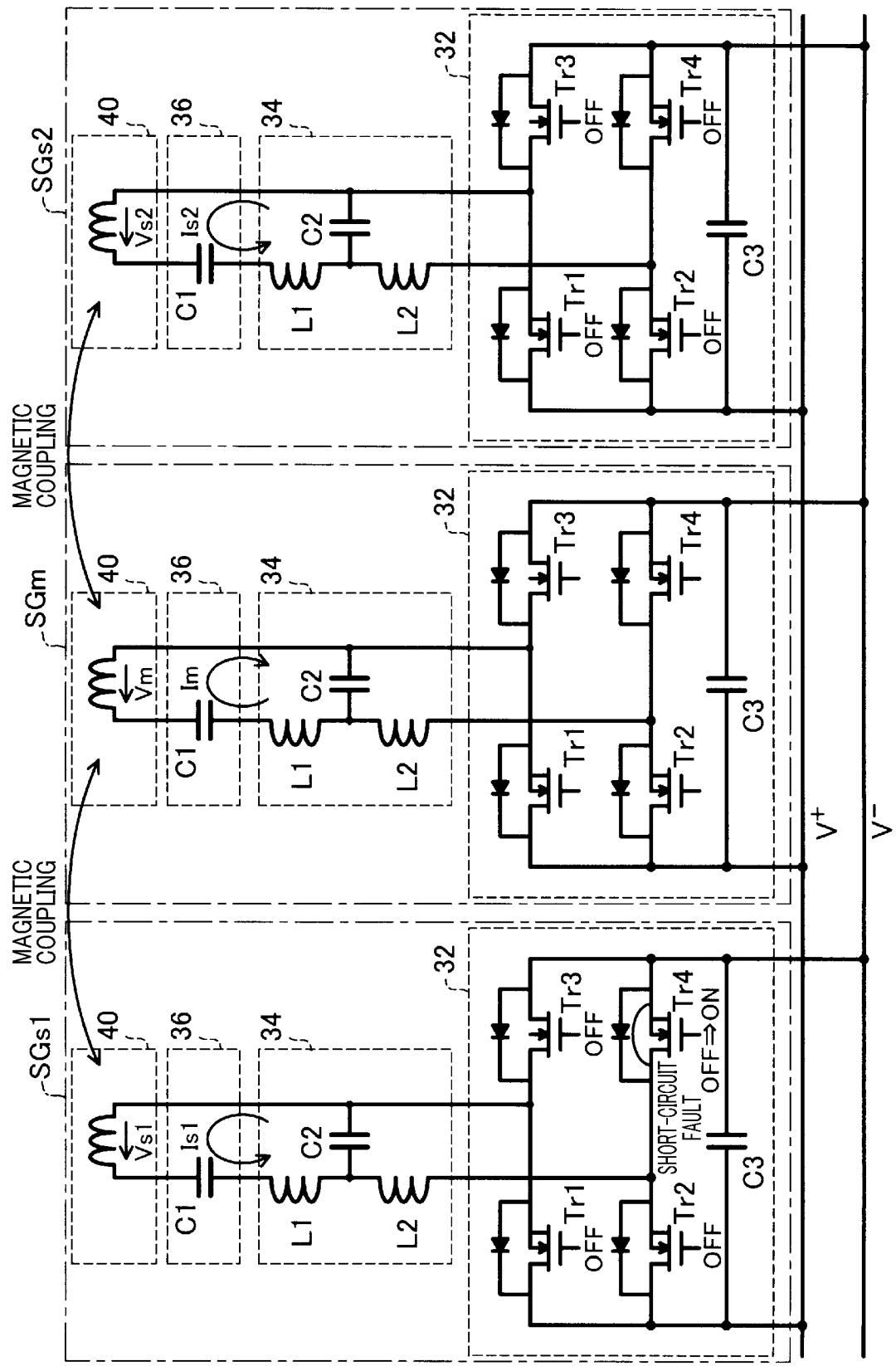

FIG. 12 illustrates a fourth assumed case where there is a short-circuit across the switching transistor Tr4, so that the switching transistor Tr4 is always on.

Figure 13:
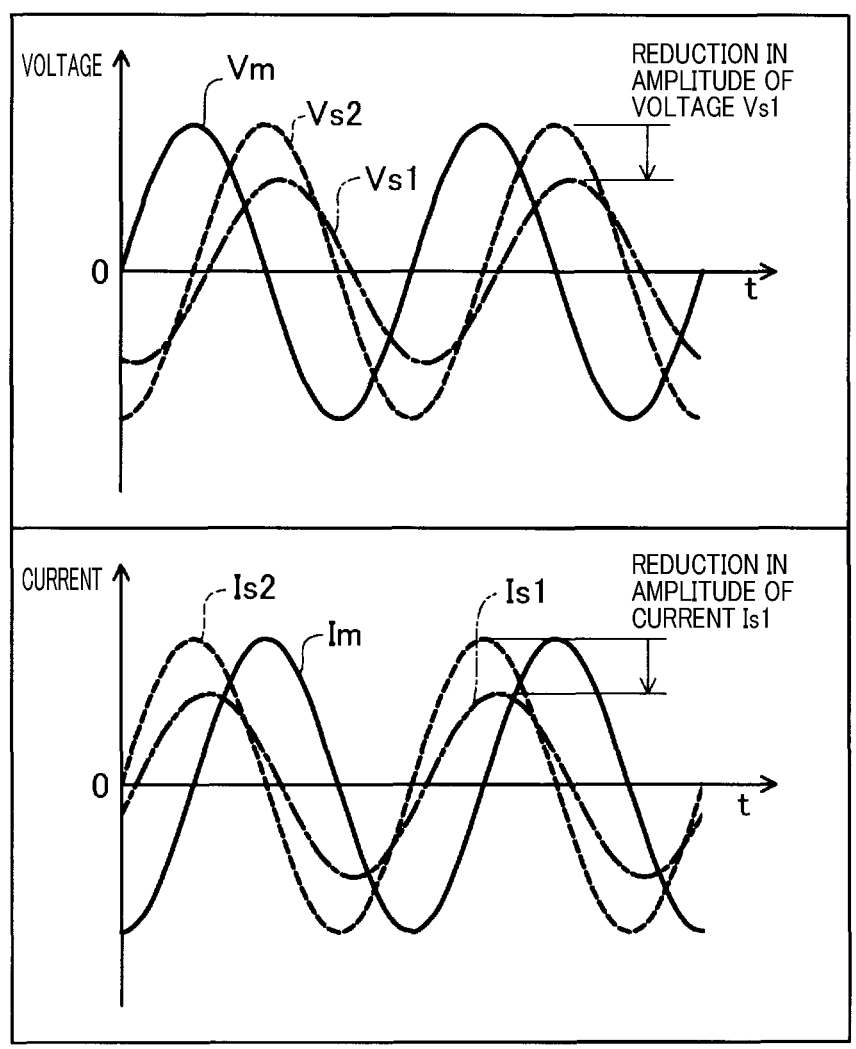
FIG. 13 is a set of graphs illustrating simulation results of electrical characteristics of the power transmission segment and power non-transmission segments for the fourth assumed case.

FIG. 13 is a set of graphs illustrating simulation results of the electrical characteristics of the segments SGs1, SGs2, and SGm for the fourth assumed case.

Specifically, as illustrated in FIG. 13, the amplitude of the current Is1 flowing through the power transmission coil 40 of the power non-transmission segment SGs1 with the short-circuited switching transistor Tr4 is lower than that of the current Is1 flowing through the power transmission coil 40 of the power non-transmission segment SGs1 whose switching transistor Tr4 has no short circuit. Additionally, the amplitude of the voltage Vs1 induced across the resonance circuit 36 of the power non-transmission segment SGs1 with the short-circuited switching transistor Tr4 is lower than that of the voltage Vs1 induced across the resonance circuit 36 of the power non-transmission segment SGs1 whose switching transistor Tr4 has no short circuit.

In accordance with the above electrical characteristics, the control unit 16 determines that there is a short-circuit across the switching transistor Tr4 of the inverter 32 of the power non-transmission segment SGs1 in response to determination that, for example, the amplitude of each of the current Is1 and voltage Vs1 induced in the power non-transmission segment SGs1 is lower than that of a corresponding one of an allowable current range and an allowable voltage range previously determined for a corresponding one of the current Is1 and voltage Vs1. Similarly, it is possible to determine that there is a short-circuit across the switching transistor Tr4 of the inverter 32 of the power non-transmission segment SGs2 in response to determination that, for example, the amplitude of each of the current Is2 and voltage Vs2 induced in the power non-transmission segment SGs2 is lower than a corresponding one of an allowable current range and an allowable voltage range previously determined for a corresponding one of the current Is2 and voltage Vs2.

Figure 14:
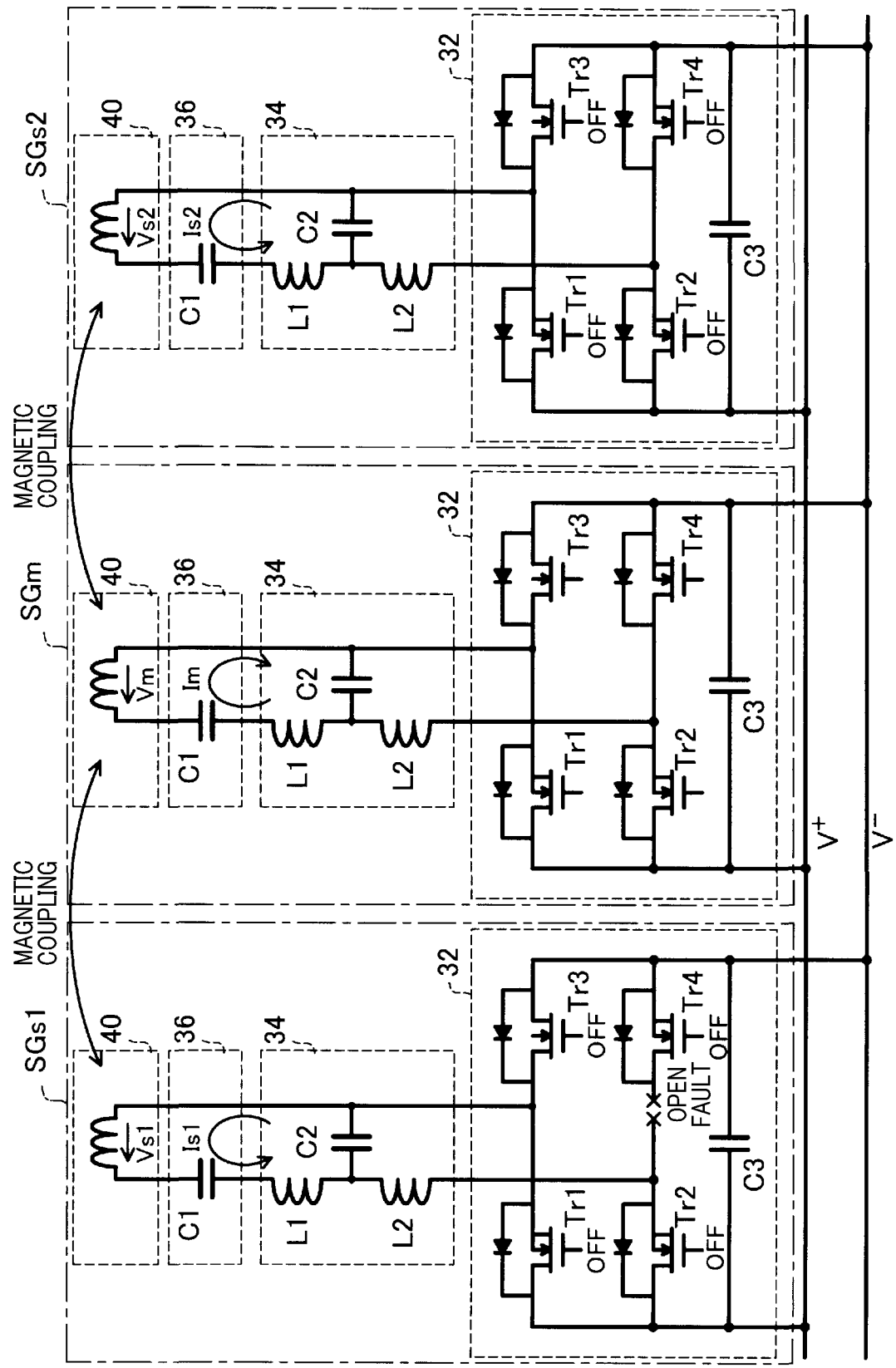
FIG. 14 is a circuit diagram illustrating a fifth assumed case where there is an open fault for the selected switching transistor of the selected power non-transmission segment so that the selected switching transistor is in a state equivalent to be in an always off.

FIG. 14 illustrates a fifth assumed case where there is an open fault for the switching transistor Tr4 of the inverter 32 of the power non-transmission segment SGs1 so that the switching transistor Tr4 is in a state equivalent to be in an always off.

Figure 15:
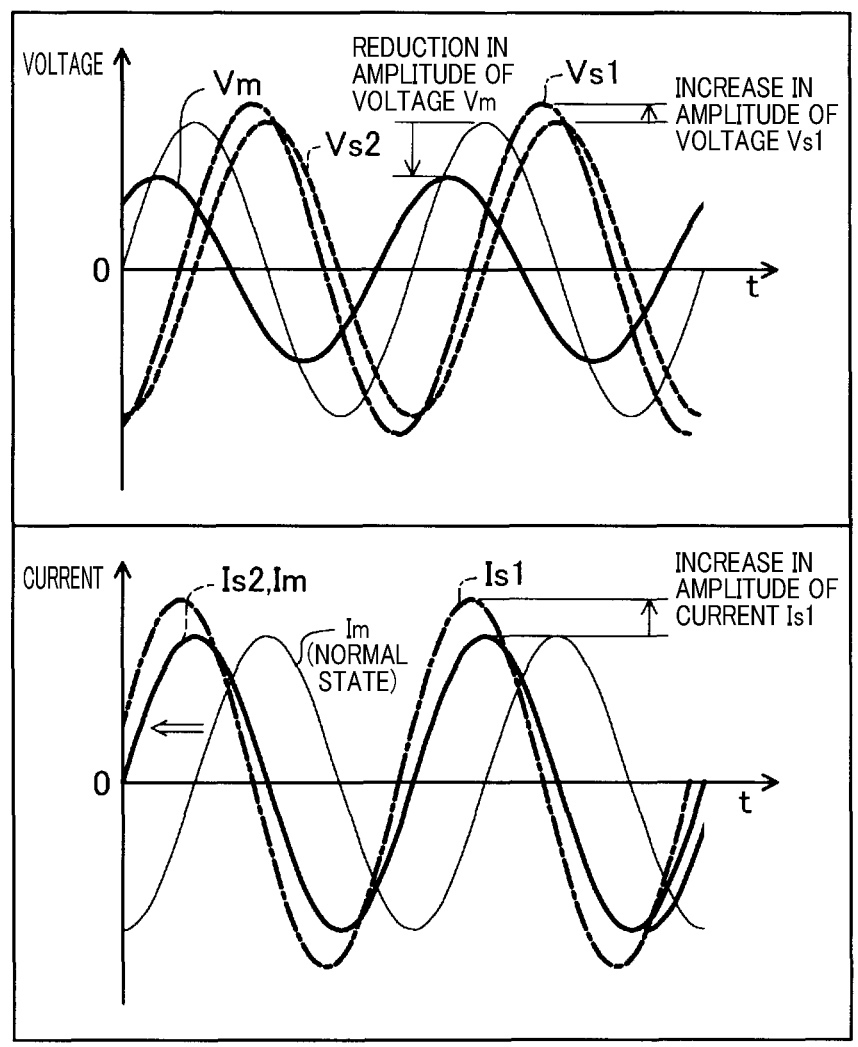
FIG. 15 is a set of graphs illustrating simulation results of electrical characteristics of the power transmission segment and power non-transmission segments for the fifth assumed case.

FIG. 15 is a set of graphs illustrating simulation results of the electrical characteristics of the segments SGs1, SGs2, and SGm for the fifth assumed case.

Specifically, as illustrated in FIG. 15, the amplitude of the current Is1 flowing through the power transmission coil 40 of the power non-transmission segment SGs1 with the open-fault switching transistor Tr4 is higher than that of the current Is1 flowing through the power transmission coil 40 of the power non-transmission segment SGs1 whose switching transistor Tr4 has no open fault.

Additionally, the phase of the current Im flowing through the power transmission coil 40 of the power transmission segment SGm advances so that the current Im is substantially in phase with the current Is2 flowing through the power transmission coil 40 of the power non-transmission segment SGs2.

The amplitude of the voltage Vs1 induced across the resonance circuit 36 of the power non-transmission segment SGs1 with the open-fault switching transistor Tr4 is higher than that of the voltage Vs1 induced across the resonance circuit 36 of the power non-transmission segment SGs1 whose switching transistor Tr4 has no open fault.

Additionally, the amplitude of the voltage Vm generated in the power transmission segment SGm with the open-fault switching transistor Tr4 of the power non-transmission segment SGs1 is lower than that of the voltage Vm generated in the power transmission segment SGm with the normal switching transistor Tr4 of the power non-transmission segment SGs1.

In accordance with the above electrical characteristics, the control unit 16 determines that there is an open fault for the switching transistor Tr4 of the inverter 32 of the power non-transmission segment SGs1 in response to determination that 1. The amplitude of the current Is1 is higher than a corresponding allowable current range for the current Is1
2. The phase of the current Im for the open-fault case advances with respect to that of the current Im for no open-fault case
3. The amplitude of the voltage Vs1 is higher than a corresponding allowable voltage range for the voltage Vs1
4. The amplitude of the voltage Vm for the open-fault case is lower than that of the voltage Vm for no open-fault case Each of the above first to fifth assumed examples shows a corresponding location where a malfunction has occurred.

Even if there is one of other malfunctions, which have not been described in the above first to fifth assumed examples, in one of the segments SGm, SGs1, and SGs2, the power supply system 100 of the exemplary embodiment can be configured to 1. Previously obtain first simulation results of how the currents Im, Is1, and Is2 flowing in the respective segments SGm, SGs1, and SGs2 are changed before and after the occurrence of one of the other malfunctions in one of the segments SGm, SGs1, and SGs2
2. Previously obtain second simulation results of how the voltages Vm, Vs1, and Vs2 generated in the respective segments SGm, SGs1, and SGs2 are changed before and after the occurrence of one of the other malfunctions in one of the segments SGm, SGs1, and SGs2
3. Determine whether there is one of the other malfunctions in which of the segments SGm, SGs1, and SGs2 in accordance with the first and second simulation results For example, the other malfunctions include 1. A ground fault for one of the switching transistors Tr1 to Tr4 in one of the segments SGm, SGs1, and SGs2
2. A short-circuit fault for one of the switching transistors Tr1 to Tr3 in one of the segments SGm, SGs1, and SGs2
3. An open fault for one of the switching transistors Tr1 to Tr3 in one of the segments SGm, SGs1, and SGs2
4. A malfunction in the filter 34 of the power non-transmission segment SGs1 or SGs2
5. A malfunction in one of the power transmission coil 40, the inverter 32, filter 34, and resonance circuit 36 in one of the segments SGm, SGs1, and SGs2

Detailed descriptions of each of the first and second simulation results are omitted.

As described above, the wireless moving-object power supply system 100 includes the power transmission sections SC, each of which includes the segment group comprised of the segments SG connected in parallel to one another. Each of segments SG included in each of the power transmission sections SC, which will be referred to simply as sections SC, is comprised of the inverter 32, the filter 34, and the resonance circuit 36.

The wireless power supply system 100 also includes the power supply circuit 10 for supplying power to each of the segments SG, and the control unit 16 for controlling operations of each segment SG.

The control unit 16 is configured to

1. Select, as the power transmission segment SGm, one of the segments SG included in a selected section SC to thereby identify a pair of segments SG located adjacent to the power transmission segment SGm as the pair of power non-transmission segments SGs1 and SGs2
2. Supply, through the power supply circuit 10, power to the power transmission segment SGm to thereby generate a magnetic field through the power transmission coil 40 of the power transmission segment SGm
3. Measure the electrical characteristics of the power transmission segment SGm, which include the current Im generated to flow through the power transmission coil 40 of the power transmission segment SGm and the voltage Vm generated across the power transmission coil 40 of the power transmission segment SGm
4. Measure, i.e., ascertain, the electrical characteristics of the power non-transmission segment SGs1 which include the current Is1 and the voltage Vs1 induced based on magnetic coupling of the power transmission coil 40 of the power non-transmission segment SGs1 to the generated magnetic field
5. Measure, i.e., ascertain, the electrical characteristics of the power non-transmission segment SGs2, which include the current Is2 induced based on magnetic coupling of the power transmission coil 40 of the power non-transmission segment SGs2 to the generated magnetic field
6. Compare each of the measured electrical characteristics with a corresponding one of allowable range previously determined for a corresponding one of the measured electrical characteristics to thereby simply determine whether there is a malfunction in each of the power transmission segment SGm and the power non-transmission segments SGs1 and SGs2

The above configuration of the control unit 16 additionally makes it possible to determine whether a malfunction has occurred in which of circuits included in each of the segments SGm, SGs1, and SGs2

The control unit 16 of the exemplary embodiment is configured to determine whether there is a malfunction in which of the segments SGm, SGs1, and SGs2 in accordance with (i) the measured voltage Vm and current Im generated in the power transmission segment Sm, (ii) the measured voltage Vs1 and current Is1 induced in the power non-transmission segment Ss1, and (iii) the measured voltage Vs2 and current Is2 induced in the power non-transmission segment Ss2.

Additionally, the control unit 16 can be configured to determine whether there is a malfunction in a power non-transmission segment SGsx located adjacent to the power non-transmission segment SGs1 located adjacent to the power transmission segment SGm in accordance with a measured voltage Vsx and current Isx generated in the power non-transmission segment SGsx.

Figure 16:
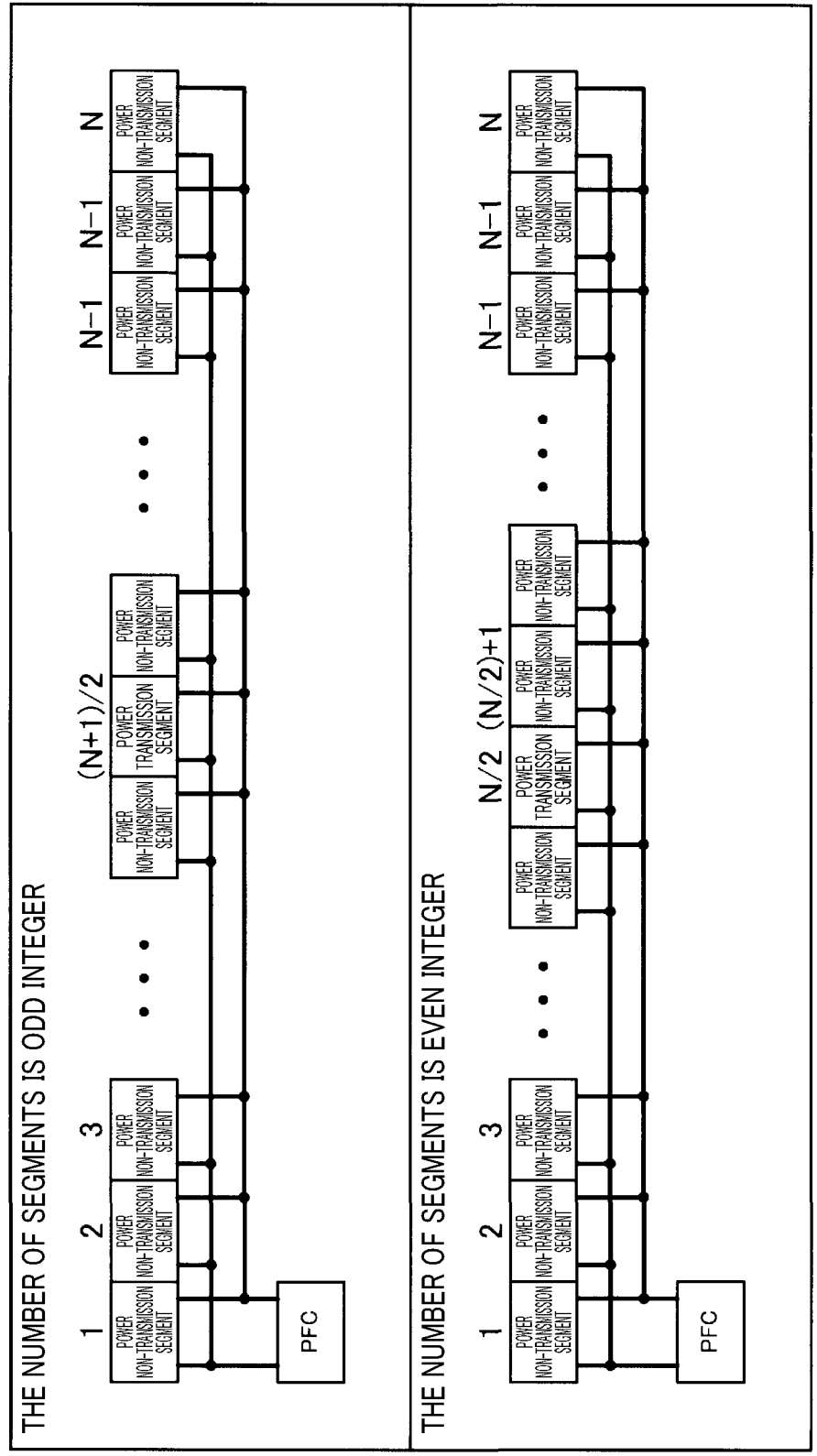
FIG. 16 is a circuit block diagram illustrating first and second selection modes, each of which represents which of the segments is selected as the power transmission segment.

FIG. 16 illustrates first and second selection modes, each of which represents which of the segments SG included in each section SC is selected as the power transmission segment SGm.

In the first selection mode where the number of segments SG in each section SC is an odd integer, the control unit 16 can be configured to select, as the power transmission segment SGm, one of the segments SG included in each section SC; the selected one of the segment SG is located at the middle of the corresponding section SC.

In the second selection mode where the number of segments SG in each section SC is an even integer, the control unit 16 can be configured to select, as the power transmission segment SGm, one of a pair of the segments SG included in each section SC; the pair of the segment SG is located at the middle of the corresponding section SC.

The magnitude of an absolute value of a current Isa flowing in a power non-transmission segment SGsa is usually smaller than that of an absolute value of a current Isb flowing in a power non-transmission segment SGsb that is located to be closer to the power transmission segment SGm than the power non-transmission segment SGsa is. Similarly, the magnitude of an absolute value of a voltage Vsa generated in the power non-transmission segment SGsa is usually smaller than that of an absolute value of a voltage Vsb generated in the power non-transmission segment SGsb that is located to be closer to the power transmission segment SGm than the power non-transmission segment SGsa is.

Defining one of the segments SG, which is located at the substantially middle of each section SC as the power transmission segment SGm enables the distance from the power transmission segment SGm to a farthermost end segment SG to be shorter as compared with a case where one of the segments SG, which is located at the other end of the corresponding section SC as the power transmission segment SGm. This results in the magnitude of the absolute value of each of the current Is and voltage Vs induced in the farthermost end segment SG being unlikely to decrease. This therefore makes it possible to easily determine whether there is a malfunction in the farthermost end segment SG from the power transmission segment SGm.

Figure 17:
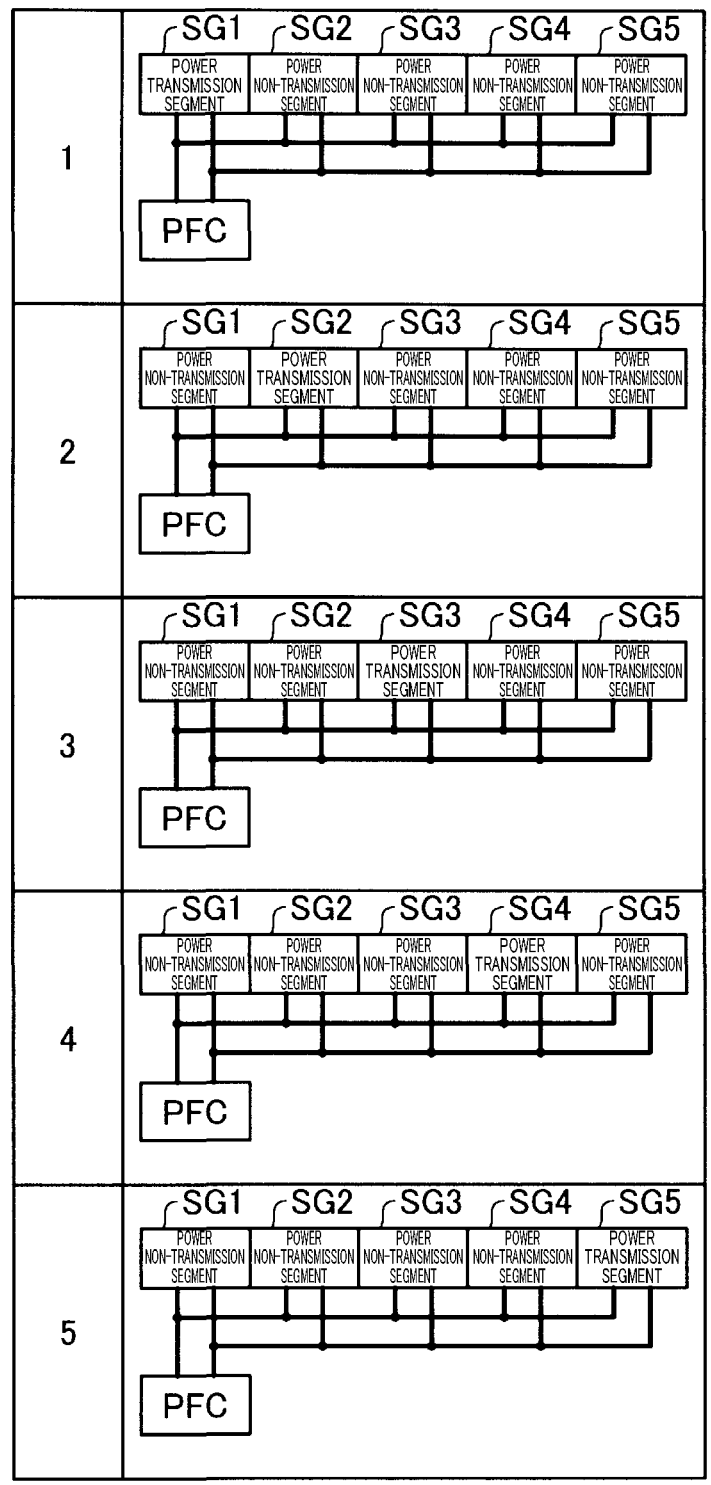
FIG. 17 is a circuit block diagram illustrating a third selection mode that the control unit selects one of the segments as the power transmission segment in a predetermined successive order.

FIG. 17 illustrates a third selection mode that the control unit 16 selects one of the segments SG1 to SG5 as the power transmission segment SGm in a predetermined successive order.

Specifically, as illustrated in FIG. 17, the control unit 16 successively selects 1. The segment SG1 as the power transmission segment SGm at a first step
2. The segment SG2 as the power transmission segment SGm at a second step next to the first step
3. The segment SG3 as the power transmission segment SGm at a third step next to the second step 4. The segment SG2 as the power transmission segment SGm at a fourth step next to the third step 5. The segment SG3 as the power transmission segment SGm at a fifth step next to the fourth step In particular, the control unit 16 is preferably configured to 1. Measure, for each of the first to fifth steps, the current Im flowing in the power transmission segment SGm and the currents Is1 and Is2 flowing in the respective power non-transmission segments SGs1 and SG2 located adjacent to the selected power transmission segment SGm 2. Measure, for each of the first to fifth steps, the voltage Vm generated in the power transmission segment SGm and the voltages Vs1 and Vs2 induced in the respective power non-transmission segments SGs1 and SG2 located adjacent to the selected power transmission segment SGm 3. Determine, based on the measured currents Im, Is1, and Is2 and the measured voltages Vm, Vs1, and Vs2, whether there is a malfunction in each of the segments SGm, SGs1, and SGs2

That is, the control unit 16 can be configured not to measure currents Is flowing in the respective other power non-transmission segments SGs located non-adjacent to the power transmission segment SGm, and voltages Vs induced in the respective other power non-transmission segments SGs located non-adjacent to the power transmission segment SGm.

As described above, the control unit 16 in the third selection mode is configured to select all the segments SG as the power transmission segment SGm in a predetermined successive order. This configuration enables the control unit 16 not to determine whether there is a malfunction in a power non-transmission segment SGs in a given step when the power non-transmission segment SGs is located far away from the power transmission segment SGm, and to determine whether there is a malfunction in the power non-transmission segment SGs in a selected step when the power non-transmission segment SGs is located adjacent to the power transmission segment SGm. This enables the control unit 16 to perform determination of whether a malfunction has occurred in a power non-transmission segment SGs in accordance with the larger magnitude of an absolute value of each of a current Is and a voltage Vs induced in the power non-transmission segment SGs.

For example, when performing the malfunction determination routine illustrated in FIG. 7, the control unit 17 can be programmed to successively select all the segments SG as the power transmission segment SGm. As another example, the control unit 17 can be programmed to repeatedly perform a loop of the malfunction determination routine to select one of the segments SG as the power transmission segment SGm until the all the segments SG have been selected as the power transmission segment SGm.

Figure 18:
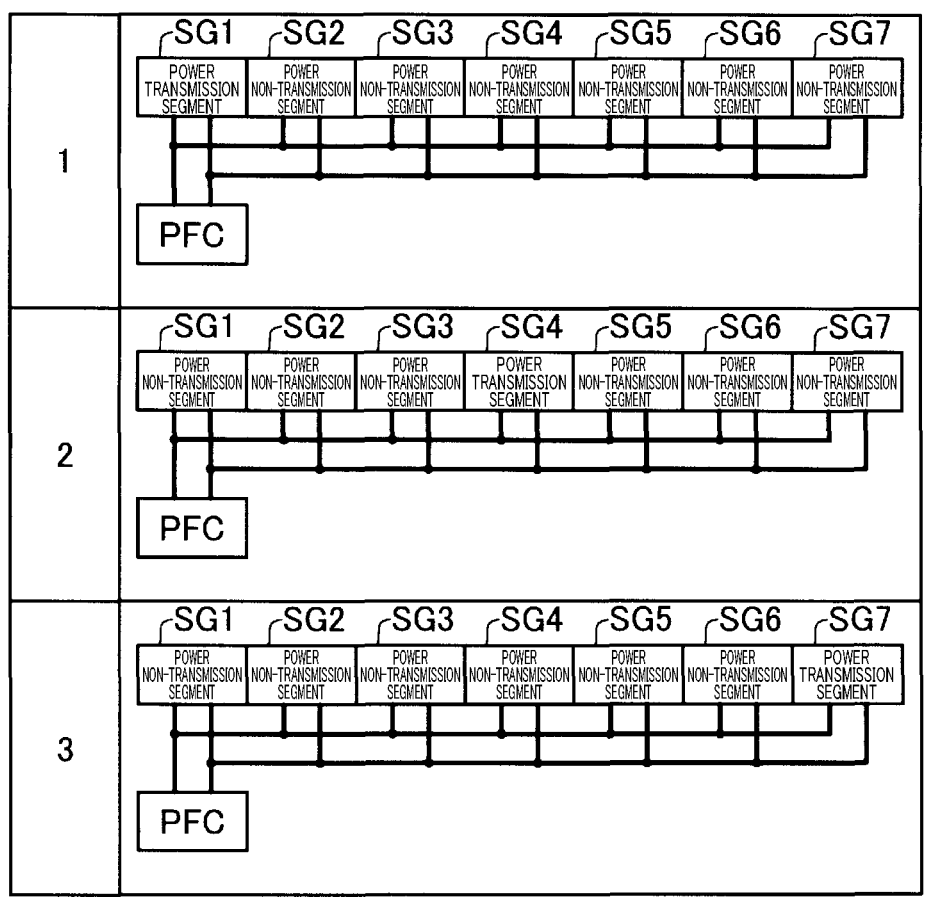
FIG. 18 is a circuit block diagram illustrating a modification of the third selection mode in which the control unit selects, in a predetermined successive order, one of the segments as the power transmission segment while skipping two segments for each selection.

FIG. 18 illustrates a modification of the third selection mode illustrated in FIG. 17. Specifically, the control unit 16 in the modification of the third selection mode selects, in a predetermined successive order, one of the segments SG1 to SG7 as the power transmission segment SGm while skipping one or more segments SG for each selection. In other words, the control unit 16 in the modification of the third selection mode selects, for each step of the predetermined successive order, one of the segments SG1 to SG7 as the power transmission segment SGm such that the selected segment SG selected as the power transmission segment SGm for the corresponding step is not adjacent to the segment SG selected as the power transmission segment SGm for the immediately previous step of the predetermined successive order.

Specifically, the control unit 16 successively selects

1. The segment SG1 as the power transmission segment SGm at a first step

2. The segment SG4 as the power transmission segment SGm while skipping two segments SG2 and SG3 at a second step next to the first step 3. The segment SG7 as the power transmission segment SGm while skipping two segments SG5 and SG6 at a third step next to the second step This enables reduction of the number of selections of one of the segments SG in each section SC as the power transmission segment SGm, making it possible to reduce a time required to perform anomaly diagnosis for all the segments SG in each section SC.

In the modification illustrated in FIG. 18, the control unit 16 successively selects one of the segments SG as the power transmission segment SGm while skipping two segments SG, but can successively select one of the segments SG as the power transmission segment SGm while skipping N segment(s) where N is a positive integer. Preferably N is set to 1 or 2.

The control unit 16 in the modification of the third selection mode enables a power non-transmission segment to be diagnosed to be reliably located adjacent to the power transmission segment SGm so that the magnitude of the absolute value of each of the current Is and the voltage Vs induced in the power non-transmission segment SGs is sufficiently large, making it possible to easily determine whether there is a malfunction in the power non-transmission segment SGs. In the modification of the third selection mode illustrated in FIG. 18, the control unit 16 selects the one-end segment SG1 as the power transmission segment SGm at the first step, but can select the segment SG2 adjacent to the one-end segment SG1 as the power transmission segment SGm at the first step.

The present disclosure is not limited to the above exemplary embodiment, and is freely modified as various embodiments within the scope of the subject matter of the present disclosure.

For example, technical features described in the exemplary embodiment, each of which corresponds to a technical feature of the above exemplary aspect of the present disclosure described in the DETAILED DESCRIPTION OF EMBODIMENTS can be replaced with other features or combined with each other for solving a part or whole of the above problem. At least one of the technical features described in the exemplary embodiment, which has not been explained in the present specification as an essential feature, can be freely eliminated.

What is claimed is:

1. A moving-object power supply system comprising:
at least one power transmission section that includes a plurality of segments connected in parallel to one another in a traveling direction of a moving object, each of the plurality of segments including an inverter, a filter, a resonance circuit, and a power transmission coil;
a power supply circuit for power supply to each of the plurality of segments; and
a control unit configured to:
select, as a power transmission segment, one of the plurality of segments included in the at least one power transmission section;

supply, through the power supply circuit, power to the power transmission segment to thereby generate a magnetic field through the power transmission coil of the power transmission segment;

ascertain a first electrical characteristic of the power transmission segment, the first electrical characteristic of the power transmission segment including a first current generated to flow through the power transmission coil of the power transmission segment and a first voltage generated across the power transmission coil of the power transmission segment;

ascertain a second electrical characteristic of at least one power non-transmission segment, the at least one power non-transmission segment being selected from the plurality of segments except for the power transmission segment, the second electrical characteristic of the at least one power non-transmission segment including a second current and a second voltage induced based on magnetic coupling of the power transmission coil of the at least one power non-transmission segment to the generated magnetic field;

previously obtain a simulated change of each of the first current and the first voltage as the first electrical characteristic due to an occurrence of one of a first ground fault, a first short-circuit fault, and a first open fault in the power transmission segment;

previously obtain a simulated change of each of the second current and the second voltage as the second electrical characteristic due to an occurrence of one of a second ground fault, a second short-circuit fault, and a second open fault in the power non-transmission segment;

perform a first comparison between: (i) the obtained simulated change of each of the first current and the first voltage; and (ii) an actual value of a corresponding one of the first current and the first voltage;

perform a second comparison between: (i) the obtained simulated change of each of the second current and the second voltage; and (ii) an actual value of a corresponding one of the second current and the second voltage; and determine, based on a result of each of the first comparison and the second comparison, whether there is a malfunction in each of the power transmission segment and the at least one power non-transmission segment.

2. The moving-object power supply system according to claim 1, wherein:

the at least one power transmission section comprises a plurality of power transmission sections, so that each of the plurality of power transmission sections comprises the plurality of segments, and the control unit is configured to determine, for each of the plurality of power transmission sections, whether there is the malfunction in each of the power transmission segment and the at least one power non-transmission segment included in the corresponding one of the plurality of power transmission sections based on the first and second electrical characteristics; and the control unit is configured to, in response to determination that there is the malfunction in at least one of the power transmission segment and the at least one power non-transmission segment included in at least one of the plurality of power transmission sections, stop the power supply through the power supply circuit to the at least one of the plurality of power transmission sections.

3. The moving-object power supply system according to claim 1, wherein:

the control unit is configured to, in response to determination that there is the malfunction in at least one of the power transmission segment and the at least one power non-transmission segment, stop the power supply through the power supply circuit to the at least one of the power transmission segment and the at least one power non-transmission segment.

4. The moving-object power supply system according to claim 1, wherein:

the control unit is configured to select, as the power transmission segment, one of the plurality of segments in a predetermined successive order.

5. The moving-object power supply system according to claim 4, wherein: the at least one power non-transmission segment is located adjacent to the power transmission segment; and the control unit is configured to:
ascertain the second electrical characteristic of the at least one power non-transmission segment located adjacent to the power transmission segment; and determine, based on the first and second electrical characteristics, whether there is the malfunction in each of the power transmission segment and the at least one power non-transmission segment.

6. The moving-object power supply system according to claim 4, wherein:

the control unit is configured to select, as the power transmission segment, one of the plurality of segments while skipping at least N segment(s) where N is a positive integer.

7. The moving-object power supply system according to claim 1, wherein:

the control unit is configured to select, as the power transmission segment, one of the plurality of segments, the selected one of the plurality of segments being located at a middle of the power transmission section.

8. The moving-object power supply system according to claim 1, wherein:

the control unit is configured to determine whether there is at least one of a ground fault, a short-circuit fault, and an open fault as examples of the malfunction for at least one of the inverter, filter, resonance circuit, and the power transmission coil of each of the power transmission segment and the at least one power non-transmission segment.

* * * * *